United States Patent
Udrea et al.

(10) Patent No.: US 11,067,422 B2
(45) Date of Patent: Jul. 20, 2021

(54) THERMAL FLUID FLOW SENSOR

(71) Applicant: Cambridge GaN Devices Limited, Cambourne (GB)

(72) Inventors: Florin Udrea, Cambridge (GB); Andrea De Luca, Cambridge (GB); Giorgia Longobardi, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 0 days.

(21) Appl. No.: 16/367,815

(22) Filed: Mar. 28, 2019

(65) Prior Publication Data

US 2019/0301906 A1 Oct. 3, 2019

Related U.S. Application Data

(63) Continuation-in-part of application No. 15/938,425, filed on Mar. 28, 2018, now Pat. No. 10,593,826.

(51) Int. Cl.
| | |
|---|---|
| *G01F 1/688* | (2006.01) |
| *G01F 1/698* | (2006.01) |
| *G01L 9/00* | (2006.01) |
| *H01L 35/34* | (2006.01) |
| *H01L 35/30* | (2006.01) |

(Continued)

(52) U.S. Cl.
CPC ............ *G01F 1/6888* (2013.01); *G01F 1/698* (2013.01); *G01L 9/008* (2013.01); *H01L 35/34* (2013.01); *H01L 35/22* (2013.01); *H01L 35/30* (2013.01); *H01L 35/32* (2013.01)

(58) Field of Classification Search
CPC .................................................... G01F 1/6888
See application file for complete search history.

(56) References Cited

U.S. PATENT DOCUMENTS

| | | | |
|---|---|---|---|
| 3,992,940 A | 11/1976 | Platzer, Jr. | |
| 5,285,131 A | 2/1994 | Muller | |
| 5,500,569 A | 3/1996 | Blomberg et al. | |
| (Continued) | | | |

FOREIGN PATENT DOCUMENTS

| | | | | |
|---|---|---|---|---|
| EP | 2056337 | 6/2009 | | |
| EP | 2589958 A1 * | 5/2013 | ........... | G01N 27/128 |
| (Continued) | | | | |

OTHER PUBLICATIONS

Masayuki Abe et al., "High performance modulation doped AlGaAs/InGaAs thermopiles (H-PILEs) for Uncooled IR FPA Utilizing Integrated HEMT-MEMS Technology", the 25th International Conference on Indium Phosphide and Related Materials, 2013, Japan.

(Continued)

*Primary Examiner* — Yu-Hsi D Sun
(74) *Attorney, Agent, or Firm* — Tucker Ellis LLP

(57) ABSTRACT

We disclose herewith a heterostructure-based sensor comprising a substrate comprising an etched portion and a substrate portion; a device region located on the etched portion and the substrate portion; the device region comprising at least one membrane region which is an area over the etched portion of the substrate. At least one heterostructure-based element is located at least partially within or on the at least one membrane region, the heterostructure-based element comprising at least one two dimensional (2D) carrier gas.

17 Claims, 13 Drawing Sheets

(51) Int. Cl.
H01L 35/22 (2006.01)
H01L 35/32 (2006.01)

(56) References Cited

U.S. PATENT DOCUMENTS

| | | | |
|---|---|---|---|
| 5,644,676 | A | 7/1997 | Blomberg et al. |
| 5,827,438 | A | 10/1998 | Blomberg et al. |
| 6,297,511 | B1 | 10/2001 | Syllaios et al. |
| 6,460,411 | B1 | 10/2002 | Kersjes |
| 7,785,002 | B2 | 8/2010 | Dewes et al. |
| 8,809,786 | B2 | 8/2014 | Oulachgar et al. |
| 9,091,591 | B2 | 7/2015 | Park et al. |
| 9,297,638 | B1 | 3/2016 | Dyer |
| 2003/0223535 | A1 | 12/2003 | Leedy |
| 2008/0272389 | A1 | 11/2008 | Rogne et al. |
| 2012/0286161 | A1* | 11/2012 | Raieszadeh ............... G01J 5/06 250/338.3 |
| 2016/0109215 | A1 | 4/2016 | Dyer et al. |
| 2016/0216144 | A1 | 7/2016 | Figi |
| 2017/0301535 | A1 | 10/2017 | Tanimoto |

FOREIGN PATENT DOCUMENTS

| | | |
|---|---|---|
| EP | 2589958 A1 | 5/2013 |
| EP | 3176571 A1 | 6/2017 |
| EP | 3255423 A1 | 12/2017 |
| WO | 2002080620 | 10/2002 |
| WO | 2010151012 A | 12/2010 |
| WO | 2017153909 A1 | 9/2017 |
| WO | 2019/066145 A1 | 4/2019 |

OTHER PUBLICATIONS

Yalamarthy et al., "Tuning electrical and thermal transport in AlGaN/GaN heterostructures via buffer layer engineering", Advanced Functional Materials, 2018, vol. 28, pp. 1705823-1705832.
European Search Report from corresponding Great Britian Application No. GB1904325.6 searched on Sep. 26, 2019.
Lahiji, G. R. and Kensall, D. Wise, "A Batch-Fabricated Silicon Thermopile Infrared Detector", IEEE (Jan. 1, 1982) 9 pages.
Allison, S.C., et al. "A bulk micromachined silicon thermopile with high sensitivity", Sensors and Actuators A 104 (2003); pp. 32-39.
Ji, Xinming, et al. "A MEMS IR Thermal Source for NDIR Gas Sensors", IEEE (2006), 3 pages.
Kim, Jae-Kwan, "A new uncooled thermal infrared detector using silicon diode", Sensors and Actuators A 89 (2001), pp. 22-27.
San, Haisheng, et al. "A silicon micromachined infrared emitter based on SOI waf", SPIE vol. 6836 68360N-1, 9 pages.
Fu, Han-Kuei, et al. "A thermal emitter with selective wavelength: Based on the coupling between photonic crystals and surface plasmon polaritons", Journal of Applied Physics 105, 033505 (2009), 6 pages.
De Zoysa, Menaka, et al. "Conversion of broadband to narrowband thermal emission through energy recycling", Nature Photonics published Jul. 8, 2002; 5 pages.
Bauer, D., et al. "Design and Fabrication of a thermal infrared emitter", Sensors and Actuators A 55 (1996), pp. 57-63.
Jiang, Yu-Wei, et al. "Enhancement of thermal radiation in plasmonic thermal emitter by surface plasmon resonance", IEEE (2008) 4 pages.
Spannhake, Jan, et al. "High-temperature MEMS Heater Platforms: Long-term Performance of Metal and Semiconductor Heater Materials", Sensors (2006) 6, pp. 405-419.
Shklover, Valery, et al. "High-tempurature Photonic Structures. Thermal Barrier Coatings, Infrared Source and Other Applications", American Scientific Publishers (2008) vol. 5; pp. 1-32.
Weber, M., et al. "Improved design for fast modulating IR sources", Journal of Micromechanics and Microengineering (1997); pp. 210-213.

Eminoglu, Selim, et al. "Low-cost uncooled infrared detectors in Cmos process", Sensors and Acutators A 109 (2003) pp. 102-113.
Li, Fangqiang, et al. "MEMS-based plasmon infrared emitter with hexagonal hole arrays perforated in the Al—SiO2—Si structure", Journal of Micromechanics and Microengineering, 21 (2011) 105023; 7 pages (8 with cover).
Hildenbrand, Jürgen, et al. "Micromachined Mid-Infrared Emitter for Fast Transient Temperature Operation for Optical Gas Sensing Systems", IEEE, vol. 10, No. 2 (Feb. 2010), pp. 353-362.
Parameswaran, M., et al., "Micromachined Thermal Radiation Emitter from a Commercial CMOS Process", IEEE, vol. 12, No. 2 (Feb. 1991); pp. 57-59.
Barritault, Pierre, et al. "Mid-IR source based on a free-standing microhotplate for autonomous CO2 sensing in indoor applications", Sensors and Actuators A 172 (2011) pp. 379-385.
Ji, Xinming, et al. "Narrow-band Midinfrared Thermal Emitter Based on Photonic Crystal for NDIR Gas Sensor", IEEE (2010); 3 pages.
Schneeberger, N., et al. "Optimized CMOS Infrared Detector Micorsystems", IEEE (1995), pp. 198-201.
Puscasu, Irina, et al. "Plasmonic Photonic Crystal MEMS Emitter for Combat ID", SPIE vol. 8031 80312Y-1; 7 pages.
Graf, A., et al. "Review of micromachined thermopiles for infrared detection", Measurement Science and Technology 18 (2007); 18 pages.
Yuasa, Hiroyasu, et al. "Single Crystal Silicon Micromachined Pulsed Infrared Light Source", IEEE (1997), 4 pages.
Sawada, Takahiro, et al. "Surface Plasmon Polariton Based Wavelength Selective IR Emitter Combined with Microheater", IEEE (2013), 2 pages.
Lenggenhager, Rene, et al. "Thermoelectric Infrared Sensors by CMOS Technology", IEEE (1992); 3 pages.
Huang, Shao-Yu, et al. "Triple Peaks Plasmonic Thermal Emitter with Selectable Wavelength Using Periodic Block Pattern as Top Layer", IEEE (2011); 4 pages.
Tsai, Ming-Wei, et al. "Two Color Squared-lattice Plasmonic Thermal Emitter", IEEE (2006), 3 pages.
B. Van Oudheusden, "Silicon flow sensors," in Control Theory and Applications, IEE Proceedings D (1988) pp. 373-380.
B. Van Oudheusden, "Silicon thermal flow sensors," Sensors and Actuators A: Physical, vol. 30 (1992) pp. 5-26.
N. Nguyen, "Micromachined flow sensors—A review," Flow measurement and Instrumentation, vol. 8 (1997) pp. 7-16.
Y.-H. Wang et al., "MEMS-based gas flow sensors," Microfluidics and nanofluidics, vol. 6 (2009) pp. 333-346.
J. T. Kuo et al., "Micromachined Thermal Flow Sensors—A Review," Micromachines, vol. 3 (2012) pp. 550-573.
A. Van Putten and S. Middelhoek, "Integrated silicon anemometer," Electronics Letters, vol. 10 (1974) pp. 425-426.
A. Van Putten, "An integrated silicon double bridge anemometer," Sensors and Actuators, vol. 4 (1983) pp. 387-396.
B. Van Oudheusden and J. Huijsing, "Integrated flow friction sensor," Sensors and Actuators, vol. 15 (1988) pp. 135-144.
J. H. Huijsing et al., "Monolithic integrated direction-sensitive flow sensor," Electron Devices, IEEE Transactions on, vol. 29 (1982) pp. 133-136.
W. S. Kuklinski et al., "Integrated-circuit bipolar transistor array for fluid-velocity measurements," Medical and Biological Engineering and Computing, vol. 19 (1981) pp. 662-664.
T. Qin-Yi and H. Jin-Biao, "A novel CMOS flow sensor with constant chip temperature (CCT) operation," Sensors and actuators, vol. 12 (1987) pp. 9-21.
D. Moser et al., "Silicon gas flow sensors using industrial CMOS and bipolar IC technology," Sensors and Actuators A: Physical, vol. 27 (1991) pp. 577-581.
L. Lofdahl et al., "A sensor based on silicon technology for turbulence measurements," Journal of Physics E: Scientific Instruments (1989) vol. 22, p. 391.
R. Kersjes et al., "An integrated sensor for invasive blood-velocity measurement," Sensors and Actuators A: Physical, vol. 37 (1993) pp. 674-678.

(56) References Cited

OTHER PUBLICATIONS

A. Van der Wiel et al.,"A liquid velocity sensor based on the hot-wire principle," Sensors and Actuators A: Physical, vol. 37 (1993) pp. 693-697.
E. Yoon and K. D. Wise, "An integrated mass flow sensor with on-chip CMOS interface circuitry," Electron Devices, IEEE Transactions on, vol. 39 (1992) pp. 1376-1386.
N. Sabate et al., "Multi-range silicon micromachined flow sensor," Sensors and Actuators A: Physical, vol. 110 (2004) pp. 282-288.
Yoo et al., "Fabrication, characterization and application of a microelectromechanical system (MEMS) thermopile for non-dispersive infrared gas sensors", Measurement Science and Technology, vol. 22 (2011) 115206; 11 pages.
Minmin Hou et al: "Finite element thermal analysis of localized heating in AIGaNIGaN Hemt based sensors pp. 25-31 doi: 10.1109/ITHERM.2014.6892260"; Stanford University, CA, USA; 6 pages.
GB Search Report for corresponding GB Application No. 1904344.7, dated Sep. 26, 2019, 4 pages.

\* cited by examiner

THERMAL FLUID FLOW SENSOR

RELATED APPLICATION DATA

This application is a continuation-in-part (CIP) of U.S. patent application Ser. No. 15/938,425, filed Mar. 28, 2018, the disclosure of which is incorporated herein by reference in its entirety.

FIELD OF THE INVENTION

This disclosure relates to a micro-machined sensor. Particularly, but not exclusively, this disclosure relates to a hetero-structure based thermal fluid flow sensor.

BACKGROUND OF THE INVENTION

Thermal fluid flow sensors rely on the thermal interaction between the sensor itself and the fluid. Depending upon the physical phenomena governing the interaction, flow sensors can be can be classified into the following three categories: (i) anemometric sensors measure the convective heat transfer induced by fluid flow passing over a heated element; (ii) calorimetric sensors detect the asymmetry of the temperature profile generated by a heated element and caused by the forced convection of the fluid flow; (iii) time of flight (ToF) sensors measure the time elapsed between the application and the sensing of a heat pulse.

Detailed reviews of thermal fluid flow sensors have been published (B. Van Oudheusden, "Silicon flow sensors," in Control Theory and Applications, IEE Proceedings D, 1988, pp. 373-380; B. Van Oudheusden, "Silicon thermal flow sensors," Sensors and Actuators A: Physical, vol. 30, pp. 5-26, 1992; N. Nguyen, "Micromachined flow sensors-A review," Flow measurement and Instrumentation, vol. 8, pp. 7-16, 1997; Y.-H. Wang et al., "MEMS-based gas flow sensors," Microfluidics and nanofluidics, vol. 6, pp. 333-346, 2009; J. T. Kuo et al., "Micromachined Thermal Flow Sensors-A Review," Micromachines, vol. 3, pp. 550-573, 2012). Further background can also be found in U.S. Pat. No. 6,460,411 by Kersjes et al.

In A. Van Putten and S. Middelhoek, "Integrated silicon anemometer," Electronics Letters, vol. 10, pp. 425-426, 1974 and A. Van Putten, "An integrated silicon double bridge anemometer," Sensors and Actuators, vol. 4, pp. 387-396, 1983 resistor based anemometers are integrated on chip within Wheatstone bridge configurations. B. Van Oudheusden and J. Huijsing, "Integrated flow friction sensor," Sensors and Actuators, vol. 15, pp. 135-144, 1988 propose a thermal flow sensor, calibrated for friction measurements, wherein thermocouples in addition to heating resistors and an ambient temperature monitoring transistor are integrated on chip. J. H. Huijsing et al., "Monolithic integrated direction-sensitive flow sensor," Electron Devices, IEEE Transactions on, vol. 29, pp. 133-136, 1982, W. S. Kuklinski et al., "Integrated-circuit bipolar transistor array for fluid-velocity measurements," Medical and Biological Engineering and Computing, vol. 19, pp. 662-664, 1981, U.S. Pat. No. 3,992,940 by Platzer and T. Qin-Yi and H. Jin-Biao, "A novel CMOS flow sensor with constant chip temperature (CCT) operation," Sensors and actuators, vol. 12, pp. 9-21, 1987 are examples of transistor based anemometers. The main drawback of all the previously mentioned citations resides in the lack of an effective thermal isolation of the heated element, which results in high power dissipation, low sensitivity, and slow dynamic response of the sensor.

In D. Moser et al., "Silicon gas flow sensors using industrial CMOS and bipolar IC technology," Sensors and Actuators A: Physical, vol. 27, pp. 577-581, 1991 an array of seven npn transistors are used as heating elements and suspended on a crystal silicon cantilever beam for effective thermal isolation. An ordinary pn diode measures the temperature on the beam. The voltage across nineteen silicon/aluminium thermocouples, with hot junctions on the beam and cold junctions on the substrate, is correlated to the gas flow velocity while the heater is driven at constant power. The issue associated with the use of a cantilever structure is that they suffer from mechanical fragility and vibration sensitivity.

Similarly, L. Lofdahl et al., "A sensor based on silicon technology for turbulence measurements," Journal of Physics E: Scientific Instruments, vol. 22, p. 391, 1989 present a heating resistor and a heater temperature sensing diode integrated on a cantilever beam. Polyimide is used as thermal isolation material between the beam and the substrate. The use of polyimide, although improving the beam thermal isolation, further affects the mechanical robustness of the beam.

In R. Kersjes et al., "An integrated sensor for invasive blood-velocity measurement," Sensors and Actuators A: Physical, vol. 37, pp. 674-678, 1993 a polysilicon heater, driven at constant heating power, and a first diode, used for heater temperature monitoring, are placed on a silicon membrane. A second diode is placed on the substrate for ambient temperature monitoring. A similar sensor is also presented in A. Van der Wiel et al., "A liquid velocity sensor based on the hot-wire principle," Sensors and Actuators A: Physical, vol. 37, pp. 693-697, 1993, where more transistors, in diode configuration, are connected in series in order to improve the temperature sensitivity of the sensor. The use of silicon as membrane material is not ideal due to the high thermal conductivity of the silicon layer. This results in high power dissipation, low sensitivity and slow dynamic response of the sensor.

In U.S. Pat. No. 6,460,411, by Kersjes et al., a silicon membrane perforated by slots of thermally insulating material is proposed as a solution to mitigate power dissipation, sensitivity and dynamic response issues, at the expenses of a more complex fabrication process, still without completely removing the silicon from the membrane.

In US20160216144A1 a CMOS flow sensor is disclosed, comprising a heating element and a number of thermocouples. Interestingly the heating element and the sensing junction of the thermocouples are thermally isolated by a dielectric membrane. However, the thermocouples still provide an additional thermal dissipation path within the membrane, thus increasing the power dissipation, lowering the sensitivity and slowing down the dynamic response of the sensor.

In E. Yoon and K. D. Wise, "An integrated mass flow sensor with on-chip CMOS interface circuitry," Electron Devices, IEEE Transactions on, vol. 39, pp. 1376-1386, 1992 a multimeasurand flow sensor is proposed. The sensor is capable of measuring flow velocity, flow direction, temperature and pressure. It also has flow discrimination capabilities. Everything is integrated with on-chip circuitry. Thermal isolation of the hot elements is provided via a dielectric membrane. However, gold is used and this make the process not fully CMOS compatible, and thus more expensive than a fully CMOS process.

N. Sabaté et al., "Multi-range silicon micromachined flow sensor," Sensors and Actuators A: Physical, vol. 110, pp. 282-288, 2004 present a multirange flow sensor using nickel resistors as temperature sensors positioned at different distances from the nickel resistive heater. Nickel is not a standard CMOS material, making the sensor fabrication process more expensive than a fully CMOS process.

SUMMARY

It is an object of this invention to provide a micromachined heterostructure-based sensor comprising a heterostructure placed on a membrane, wherein the heterostructure comprises a two dimensional (2D) carrier gas.

The devices of this disclosure are advantageous over state of the art devices as it provides:
  (i) Enhanced thermal isolation, while maintaining robustness, through the membrane structure for low power consumption, high sensitivity and fast response
  (ii) Enhanced sensing capabilities, through the employment of two dimensional carrier gas as temperature sensing element, due to the superior temperature coefficient of resistance (TCR) of this layer in comparison to standard metals and semiconductors
  (iii) Enhanced reliability through the employment of two dimensional carrier gas as heating element, due to its composition of electrons rather than atoms and thus not susceptible to detrimental long-term effects such as electromigration or corrosion.
  (iv) Enhanced functionalities, through smart designs. For example the sensor will be able to provide information regarding not only about how much fluid is flowing, but also, the direction, the temperature, the phase (gas or liquid), and the type of gas/liquid it is flowing (e.g. water, oil, air, CO2, and/or mixtures of fluids)

The disclosure benefits from the employment of a heterostructure-based device comprising a two dimensional carrier gas configured to operate as a heating element or temperature sensing element, or other sensor element. In a heterostructure based element electromigration will not be as influential as in other metallic and semiconducting-based heating elements.

Furthermore, the disclosure benefits from the employment of a heterostructure-based element comprising a two dimensional carrier gas configured to operate as a heating element, temperature sensing element or other sensor element. It is known that the electrical characteristics of these elements are extremely sensitive to temperature variations.

Furthermore, the disclosure provides a sensor employing a thermal isolation scheme (e.g. a membrane) beneficial to: (i) reduce power dissipation, (ii) improve sensitivity, (iii) improve thermal dynamics, while concurrently providing the device with a mechanically stable structure.

According to a one aspect of the present disclosure there is provided a heterostructure-based sensor comprising: a substrate comprising an etched portion and a substrate portion; a device region located on the etched portion and the substrate portion, wherein the device region comprises at least one membrane region, and wherein the at least one membrane region is an area over the etched portion of the substrate; and at least one heterostructure-based element located at least partially within or on the at least one membrane region, the heterostructure-based element comprising at least one two dimensional (2D) carrier gas.

Notably the term "heterostructure-based" does not put any limit on the number and type of the heterostructures forming the device; the device may be based on a single heterostructure, on a double heterostructure, etc. the device may also be based on a straddling gap (type I), staggered (Type II), or broken gap (type III) heterostructures.

Here the device region may refer to a region including a nucleation region, a transition region, an active region, dielectric layers, passivation layers and metal layers.

The substrate may be etched to form one or more etched portions, and one or more membrane regions. The membrane region may be the region directly above the etched portion of the substrate. Each membrane region may be supported along its entire perimeter by the substrate portion, and may be above a single etched portion of the substrate with no substrate portion underneath the membrane region.

The flow sensor may be used in applications ranging from smart energy (e.g. HVAC, white goods, gas metering) and industrial automation (e.g. leakage testing, dispensing, analytic instruments) to medical (e.g. spirometry, capnometry, respirators, inhalers, drug delivery) and fluid dynamics research (e.g. turbulence measurements, flow attachment). Interestingly, this invention also enables application in harsh environments (ambient temperature from cryogenic regime up to 300° C.), such as boilers, automotive, space and others.

Such a configuration may be employed in a variety of sensors such as thermal conductivity, flow, gas, or Infra-red (IR) sensors. The device may also comprise an IR emitter using a micro-heater as described in U.S. patent application Ser. No. 15/938,425 which is incorporated by reference in its entirety.

The at least one membrane region may be configured at a higher temperature than the substrate portion.

The heterostructure-based element may comprise a first part located within or on the at least one membrane region, and a second part located outside the at least one membrane region. In other words, a first portion of the heterostructure based element may be located above the substrate portion and a second portion of the heterostructure based element may be located above the etched portion. The 2D carrier gas may be located completely within the membrane region or may be partly located above the substrate portion and partly above the etched portion. The first part of the heterostructure-based element may be configured to be exposed to a higher temperature than the second part of the heterostructure-based element. The part of the heterostructure-based element and the 2D carrier gas formed within the membrane will be exposed to a higher temperature, either enabled by a heating element provided in the membrane or via self-heating.

Preferably the sensor will be operated as a flow-sensor, gas-sensor, thermal conductivity sensor, or IR emitter and detector.

The sensor may be configured as a gas sensor. The 2D carrier gas is extremely susceptible to external chemical stimuli. Gas molecules can interact with the 2D carrier gas and modify its properties (e.g. resistance). Tailored sensing layers and or tailored surface modifications could also be introduced or implemented to improve the gas response and selectivity.

Alternatively, the 2DEG could be used as a heater or a temperature sensor. A sensing layer such as a metal oxide (tin oxide, tungsten oxide, zinc oxide etc) or polymer could be placed above the heater and at a particular temperature (controlled by the heater and/or the temperature sensor), the resistance of the sensing layer could change with the concentration of a specific gas. Typical gases to be sensed are Carbon Monoxide, Volatile Organic Compounds (VOCs), Ethanol, Nitric oxide and nitric dioxide.

The sensor may be configured as a thermal conductivity sensor. Different gases have different thermal properties (e.g. thermal conductivity, thermal capacity, etc.). By positioning temperature sensing elements on the membrane at different distances from the heating element it is possible to sense the gas thermal properties and thus discriminate between gases based on their differences in the thermal conductivity. By measuring accurately the temperature profile given by different sensing elements it is also possible to measure the concentration of the gas. Typical gases to be sensed in this way are Hydrogen, Methane and Carbon dioxide.

The sensor may be configured as a flow sensor. Advantageously, the device may be configured to measure the variations of heat exchange between the device itself and the environment by means of sensing the change in the temperature, the change in the voltage, when supplied to a constant current, or the change in the power when the 2D carrier gas of the heterostructure is operated at constant temperature. This arrangement is suitable to use as a flow sensor, but could be used in other sensors using a similar concept such as gas sensors, thermal conductivity sensors or IR emitters and detectors.

Injection of a current into the 2D carrier device formed within the membrane results in a localised increase in temperature. The heat exchange between the 2D carrier gas type device and the fluid can then be measured through the change in the resistance of the 2D carrier gas itself, due to the change in the electron (or hole) mobility, and correlated to the at least one property of the fluid (e.g. velocity, flow rate, exerted wall shear stress, pressure, temperature, direction, thermal conductivity, diffusion coefficient, density, specific heat, kinematic viscosity, etc.). Sensing of such fluid properties can enable fluid discrimination (or differentiation) . For instance, the flow sensor can sense if the fluid is in gas form or liquid form, or the sensor can discriminate between different fluids (e.g. between air and $CO_2$), or if the fluid is a mixture the sensor can measure the mixture ratio. Both qualitative (e.g. liquid or gas form) and quantitative information (e.g. gas concentration) of the fluid properties can be obtained.

One or more temperature sensing elements (2D carrier gas or alternative temperature sensing elements) and one or more heating elements may be embedded within the membrane. The choice of the shape, position, and number of temperature sensing elements and heating elements can be modified to generate the temperature profile and/or map the temperature profile distribution over the membrane to achieve a specific performance, and can result in multi-directional, multi-range, multi-properties sensing capabilities. For instance the flow sensor may be designed to sense both flow rate and flow direction, or flow rate, flow direction and fluid thermal conductivity, or any other combination of fluid properties.

The at least one heterostructure-based element may comprise a first III-nitride semiconductor layer having a first band gap and a second III-nitride semiconductor layer having a second bandgap different from the first band gap disposed on the first III-nitride semiconductor layer, and the two dimensional carrier gas may be formed between the first and second III-nitride semiconductor layers. The heterostructure may be formed at the interface between the first and second III-nitride semiconductor layers. The first and second III-nitride semiconductor layers (which may be GaN and AlGaN layers) may be both epitaxially grown on a substrate such as silicon, silicon carbide, diamond, or GaN. At the interface between the semiconductor layers, the 2D carrier gas layer is formed and may be controlled by the composition of the semiconductor layers, the thickness of the semiconductor layer, and the doping of the semiconductor layers.

The first III-nitride semiconductor layer may comprise any one of gallium nitride (GaN), aluminium gallium nitride (AlGaN) and indium aluminium gallium nitride (InAlGaN); and the second III-nitride semiconductor layer may comprise any one of gallium nitride (GaN), aluminium gallium nitride (AlGaN) and indium aluminium gallium nitride (InAlGaN). For example, when AlGaN and GaN layers are used, at the interface a 2DEG layer is present which is highly conductive and its conductivity could be controlled by several parameters, such as the mole fraction of the Aluminium, the thickness of the AlGaN layer, the doping of the AlGaN and GaN layers. The conductivity may further be controlled by placing a p-type GaN gate above the AlGaN layer, or an insulated gate or a Schottky gate to make a transistor.

The sensor may further comprise a transition layer located between the heterostructure based element and the substrate. The transition layer may be present between the heterostructure and the bulk substrate to minimise the lattice mismatch or accommodate the mechanical stress in the heterostructure. The transition layer may extend across the membrane region. Part of the transition layer within the membrane region may be etched to minimise the thermal conductance of the membrane.

The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In the case where the substrate is silicon and the heterostructure is based on III-Nitride compounds such as GaN, the nucleation region may be made of aluminium nitride (AlN) or any available dielectric layer (for example $SiO_2$), and the transition region may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The device region may comprise a plurality of dielectric layers. The membrane region may be a dielectric membrane. The dielectric membrane may comprise silicon dioxide and/or silicon nitride, and part of the transition layer materials. The membrane may also comprise one or more layers of spin on glass, and a passivation layer over the one or more dielectric layers. The employment of materials with low thermal conductivity (e.g. dielectrics) enables a significant reduction in power dissipation as well as an increase in the temperature gradients within the membrane with direct benefits in terms of sensor performance (e.g. sensitivity, frequency response, range, etc.).

The membrane may also have other structures made of 2D carrier gas or metal. These structures can be embedded within the membrane, above the membrane, or below the membrane, to engineer the thermo-mechanical properties (e.g. stiffness, temperature profile distribution, etc.) of the membrane and/or the fluid dynamic interaction between the fluid and the membrane. These structures can also be formed outside the membrane and/or bridging between inside and outside the membrane.

The sensor may further comprise a gate located above the heterostructure based element. Advantageously, the gate above the heterostructure based element may be used to control the conductivity of the 2D carrier gas.

The sensor may further comprise electrical connections bridging from within the membrane area to the substrate area of the chip. The electrical connections may be formed using any one or a combination of the metal layers or metallic alloy layers available in a state-of-the-art process (e.g. aluminium, tungsten, titanium, titanium nitride, copper, platinum, gold, chromium, etc.). Alternatively, the electrical connections may be formed using any one or a combination of the materials forming the heterostructure (e.g. $Al_xGaN_{1-x}N$, n-doped $Al_xGaN_{1-x}N$, p-doped $Al_xGaN_{1-x}N$). Alternatively, the electrical connections may be formed using the 2D carrier gas formed at the semiconductor layer (AlGaN/GaN) interface. Notably, the 2D carrier gas used for the electrical connection may show different electrical properties (e.g. in terms of charge density) from the 2D carrier gas comprised in the heterostructure interface (AlGaN/GaN) element formed within the membrane.

The at least one two dimensional carrier gas may be a two dimensional electron gas (2DEG) or two dimensional hole gas (2DHG). The two dimensional carrier gas may be operated as a resistive element or could be part of a FET transistor such as a High Electron Mobility Transistor (HEMT) or Metal Insulating Semiconductor Field Effect Transistor (MISFET). The 2D carrier gas may be used as a micro-heater that self-heats, when power is applied to the 2D carrier gas layer via Joule effect or could be used as temperature sensing element to detect small variations in temperature.

The 2D carrier gas may operate as a wire. As fluid flows over the 2D carrier gas, this cools the 2D carrier gas and this change in temperature can be sensed.

The two dimensional carrier gas may be configured to operate as a first heating element. The heating element may be a sensor itself. The heating element may be a resistive element or a field effect transistor.

The first heating element may be any one of a self-heated resistor or a self-heated diode. The heating element may be a passive device or an active device.

Alternatively, the first heating element may be any one of a self-heated transistor or a self-heated transistor in diode configuration. The self-heated transistor may be a high electron mobility transistor configured to control direct temperature modulation without using an external transistor. The use of a transistor (e.g. a high electron mobility transistor, HEMT) will allow direct temperature modulation (i.e. modulation of the gate results in modulation of the current flow, and thus of the Joule heating effect) without the use of an external transistor.

The two dimensional carrier gas may be configured to operate as a first heating element, and the two dimensional carrier gas may be further configured to operate as a first temperature sensing element. In other words, the 2D carrier gas type device can also be used as a heating element as well as temperature sensing device at the same time.

The heating element may comprise amperometric and voltammetric connections. Amperometric and voltammetric connections may be used for the 2D carrier gas heating element and/or additional heating elements. When the heating element is provided with both amperometric and voltammetric connections, this allows 4-wire type measurement of its resistance. Injection of a current into the resistive heating element results in a localised increase in temperature. The heat exchange between the heating element and the fluid can then be measured through the change in the conductivity of the 2D carrier gas layer (due to the change in the electron (or hole) mobility) and correlated to the at least one property of the fluid.

The sensor may further comprise a second heating element wherein the second heating element is configured to calibrate and/or recalibrate the first heating element.

The two dimensional carrier gas may be configured to operate as a first temperature sensing element. A separate heating element may be present, or the device may comprise only a temperature sensing element. The 2D carrier gas layer between the semiconductor layers of the heterostructure may be configured to operate as a temperature sensing device. This could rely on the decrease in the mobility of the electrons (or holes) within the 2D carrier gas layer when the 2D carrier gas is exposed to higher temperature.

The first temperature sensing element may comprise any one of a resistor, a transistor, a diode, or a transistor in a diode configuration. In other words, the 2D carrier gas formed at the hetero-structure, formed within the membrane, may be configured as a resistor, a diode, a transistor or an array of transistor or diodes for enhanced sensitivity. The temperature sensing element may advantageously be located in the area of the membrane having the highest thermal isolation towards the substrate.

Alternatively, the first temperature sensing element may comprise a thermopile, wherein the thermopile comprises a plurality of thermocouples, wherein each thermocouple comprises two arms coupled together to form a hot junction located within the membrane region and a cold junction located outside the membrane region.

The first temperature sensing element may be configured to measure heat exchange between the heterostructure-based element and a fluid, and the sensor may be configured to correlate the heat exchange to at least one property of the fluid so as to differentiate between forms of the fluid.

The property of the fluid may comprise any one of velocity, flow rate, exerted wall shear stress, pressure, temperature, direction, thermal conductivity, diffusion coefficient, density, specific heat, and kinematic viscosity.

The sensor may further comprise a second heating element located at least partially within or on the at least one membrane region. The additional heating element may be made of a metal or may be another 2D carrier gas element. The second heating element may be a first heating element in cases where the heterostructure based device is configured to operate as a temperature sensor. The second heating element refers to an additional heating element in addition to the heterostructure structure based device.

The 2D carrier gas of the heterostructure based element may be located directly underneath or directly on top of the second heating element. Advantageously, the 2D carrier gas device can be made very small and placed right underneath the resistive heating element in the area of the membrane having the highest increase in temperature, resulting in increased performance of the sensor (e.g. sensitivity, frequency response, range, etc.).

The at least one heterostructure-based element may be located at least partially within or on a first membrane region, and the second heating element may be located at least partially within or on the first membrane region. In other words, the heterostructure based element and the second heating element may be located within the same membrane, over a single etched cavity portion of the substrate. Alternatively, the second heating element may be located in a separate membrane to the heterostructure based element.

The sensor may further comprise a second temperature sensing element located at least partially within or on the at least one membrane region. The second temperature sensing element may be a first temperature sensing element in cases where the heterostructure based device is configured to operate as a heating element. The second temperature sensing element refers to an additional temperature sensing element in addition to the heterostructure structure based device.

The at least one heterostructure-based element may be located at least partially within or on a first membrane region, and the second temperature sensing element may be located at least partially within or on the first membrane region. In other words, the heterostructure based element and the second temperature sensing element may be located within the same membrane, over a single etched cavity portion of the substrate. Alternatively, the second temperature sensing element may be located in a separate membrane to the heterostructure based element.

One or more additional thermopiles may be used as additional temperature sensing elements. These may form the second temperature sensing element, or may form further temperature sensing elements in addition to the second temperature sensing element and the heterostructure based device. A thermopile comprises one or more thermocouples connected in series. Each thermocouple may comprise two dissimilar materials which form a junction at a first region of the membrane, while the other ends of the materials form a junction at a second region of the membrane or in the heat sink region (substrate outside the membrane area), where they are connected electrically to the adjacent thermocouple or to pads for external readout. The thermocouple materials may comprise a metal such as aluminium, tungsten, titanium, or combination of those or any other metal available in the process.

The position of each junction of a thermocouple and the number and the shape of the thermocouples may be configured to adequately map the temperature profile distribution over the membrane to achieve a specific performance.

The sensor may further comprise a heating element located outside the at least one membrane region. The further heating element may be located on the device region over the substrate portion and not over the etched portion. The further heating element outside the membrane area can be used for recalibration purposes of the active (i.e. on membrane) heating element. Alternatively, it can be used for ambient temperature compensation purposes. Alternatively it can be used for gas sensing purposes.

The sensor may further comprise a temperature sensing element located outside the at least one membrane region. The further temperature sensing element may be located on the device region over the substrate portion and not over the etched portion. This may be used to measure the ambient temperature, or to compensate for the ambient temperature.

One of the temperature sensing elements may be configured to use for flow sensing and another of the temperature sensing elements may be configured to recalibrate said one of the temperature sensing elements.

One of the temperature sensing elements may be configured to fail, and another of the temperature sensing elements may be configured to replace said one of the temperature sensing elements.

Redundancy of temperature sensing elements and/or heating elements may be used to improve the reliability/life time of the flow sensor and/or for integrity assessment. For instance, in a first case where only a first temperature sensing element is needed for flow sensing, a second temperature sensing element may be used to recalibrate the first temperature sensing element or used in place of the first temperature sensing element when aging of the first temperature sensing element occurs. In a second case, where only a first heating element is needed for flow sensing, a second heating element may be used to recalibrate the first heating element or used in place of the first heating element when aging of the first heating element occurs.

The sensor may further comprise circuitry located outside the at least one dielectric membrane.

The sensor may comprise circuitry placed outside the chip area using application specific integrated circuit (ASIC) or a discrete component, or a combination of ASIC and the discrete component. In absence of on-chip circuitry, off-chip implementation of such circuital blocks having one or more of the features disclosed for on-chip circuitry may be used. Such off-chip implementation may be done in an ASIC or by discrete components, or a mix of the two.

The sensor may be formed with circuitry in the same package. In other words, the sensor may further comprise circuitry, wherein the sensor and the circuitry are formed in a single package.

Analogue or digital circuitry may be integrated on-chip.

The circuitry may comprise any one of:
a voltage proportional to absolute temperature (VPTAT);
a current proportional to absolute temperature (IPTAT);
switches, multiplexer, decoder, filter, amplifier, analogue to digital converter, timing blocks, RF communication circuits, memories, and/or means for driving and reading out from the heating elements and/or temperature sensing elements; and/or
means for electronically manipulating sensor signals; and/or
means for enabling/disabling sensor elements.

For example, it is demonstrated that a heating element driven in constant temperature mode results in enhanced performance and having on-chip means to implement this driving method would result in a significant advancement of the state-of-the-art flow sensors. Also the driving method known a 3ω may be implemented via on-chip means, or any other driving method, such as constant temperature difference and time of flight, needed to achieve specific performance (e.g. power dissipation, sensitivity, dynamic response, range, fluid property detection, etc.).

The heterostructure-based element may be configured to operate in a forward bias mode in which a forward voltage across the heterostructure-based element decreases linearly with a temperature when operated at a constant forward current.

Alternatively, the heterostructure-based element may be configured to operate in a reverse bias mode where a leakage current is exponentially dependent on a temperature.

The heterostructure-based element may be configured to operate in any one of a pulse mode and a continuous mode. The heater and the 2D carrier gas type device may be operated in a pulse mode (e.g. driven with a square wave, sinusoidal wave, Pulse Width Modulated wave, etc.) or continuous mode. The pulse mode has, among others, the advantage of reduced power consumption, reduced electromigration for enhanced device reliability/lifetime and improved fluid properties sensing capabilities.

The sensor may further comprise a further etched portion of the substrate and a further membrane region over an area of the further etched portion of the substrate. In other words the sensor may include more than one etched portion, a dielectric region located on the substrate, wherein the dielectric region comprises a dielectric membrane over each area of the etched portion of the substrate. Each membrane may contain any combination of the features described in the previous embodiments.

The features of each membrane may be configured to result in multi-directional, multi-range, multi-properties sensing capabilities. For instance the flow sensor may be designed to have a first membrane containing features to sense flow rate and a second membrane containing features to sense flow direction, or a first membrane containing features to sense flow rate and flow direction and a second membrane containing features to sense fluid thermal conductivity. Any other combination of fluid properties is also possible.

The sensor may further comprise a pressor sensor located in the further membrane region, and the pressor sensor may comprise at least one piezo-element. The flow sensor, in addition to the at least one membrane containing any combination of the features described previously, may also be designed to have one or more additional membranes used as pressure sensors. Membrane based pressure sensors rely on piezo-elements (e.g. piezo-resistors, piezo-diodes, piezo-FET, etc.) to have an electric signal proportional to the displacement of the membrane after a pressure is applied. The pressure sensing membrane may be also used for pressure compensation purposes, to improve the flow sensor performance (e.g. sensitivity, range, dynamic response, etc.), to increase the flow sensor reliability/life time and/or for integrity assessment.

The substrate may comprise any one of:
silicon;
silicon on insulator (SOI);
silicon carbide;
gallium arsenide;
gallium nitride; and/or
a combination of silicon carbide, diamond, sapphire, gallium nitride with silicon.

The starting substrate may be silicon, silicon on insulator (SOI), Silicon Carbide, Sapphire or Diamond. In particular the use of silicon is advantageous, as it guarantees sensor manufacturability in high volume, low cost and high reproducibility. Employment of a silicon substrate facilitates etching techniques, guarantees sensor manufacturability in high volume, low cost, high reproducibility, and wide availability of foundries supporting the process. Furthermore, a silicon substrate allows CMOS processes to be used and thus enables on-substrate circuitry integration for sensor performance enhancement and system integration facilitation. The use of a silicon substrate could also enable on-chip circuitry for sensor performance enhancement and system integration facilitation. Such on-chip circuitry could be implemented using various transistors in GaN/AlGaN material but also in the silicon substrate underneath.

Also, this disclosure covers the possibility of growing the heterostructure on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The device may be packaged using one or more of:
a metal transistor output (TO) type package;
a ceramic, metal or plastic surface mount package;
a flip-chip method;
a chip or wafer level package;
a printed circuitry board (PCB).

The device may be packaged in a metal TO type package, in a ceramic, metal or plastic SMD (surface mount device) package. The device may also be packaged directly on a PCB, or be packaged in a flip-chip method. The device may also be embedded in a substrate, such as a customised version of one of the previously mentioned package, a rigid PCB, a semi-rigid PCB, flexible PCB, or any other substrate, in order to have the device surface flush with the substrate surface. The device membrane may be hermetically or semi-hermetically sealed with a gas (e.g. air, dry air, argon, nitrogen, xenon or any other gas) or a liquid, to engineer the thermo-mechanical properties of the device. The device may also be packaged in a vacuum. The package can also be a chip or wafer level package, formed for example by wafer-bonding.

The sensor may further comprise through silicon via (TSV) configured to implement a three dimensional (3D) stacking technique. The flow sensor may have through silicon vias (TSV), to avoid the presence of bond wires in proximity of the sensitive area of the device which might affect the flow sensor readings. Advantageously, a flow sensor with TSV can enable 3D stacking techniques. For instance the flow sensor chip can sit on top of an ASIC, thus reducing the sensor system size.

The membrane region may have any of:
a circular shape;
a rectangular shape;
a square shape; and
a rounded corner shape.

The membrane may be circular, rectangular, or rectangular shaped with rounded corners to reduce the stresses in the corners, but other shapes are possible as well.

The two dimensional carrier gas may have any one of a circular shape, a rectangular shape, and a hexagonal shape.

According to a further aspect of the present disclosure there is provided a method of manufacturing a heterostructure-based sensor comprising: forming at least one membrane region on a substrate comprising an etched portion, wherein the at least one membrane region is an area over the etched portion of the substrate; and forming at least one heterostructure-based element at least partially within or on the at least one membrane region, wherein the at least one heterostructure-based element comprises at least one two dimensional carrier gas.

The at least one membrane region may be formed by any one of: back-etching using Deep Reactive Ion Etching (DRIE) of the substrate, which results in vertical sidewalls; and using anisotropic etching such as KOH (Potassium Hydroxide) or TMAH (Tetra Methyl Ammonium Hydroxide) which results in slopping sidewalls. Back-etching using Deep Reactive Ion Etching (DRIE) of the substrate enables a reduction in sensor size and costs.

The nucleation layer (which may be formed on AlN) may be used as an etch stop during the DRIE or wet etching processes. Subsequently the AlN nucleation layer may be removed during etching, to lower the thermal conductivity of the membrane stack and increase the sensitivity of the sensor.

The membrane can also be formed by a front-side etch or a combination of a front-side and back-side etch to result in a suspended membrane structure, supported only by 2 or more beams.

The invention is described here with reference to thermal fluid flow sensors, but it is applicable to other sensors based on thermal concept, such as gas sensors, IR detectors and emitters and thermal conductivity sensors. The invention is also applicable to catalytic sensors by detecting the amount of heat produced by a reaction.

Many other effective alternatives will occur to the person skilled in the art. It will be understood the disclosure is not limited to the described embodiments, but encompasses all the modifications which fall within the spirit of the disclosure.

BRIEF DESCRIPTION OF THE PREFERRED EMBODIMENTS

Some preferred embodiments of the disclosure will now be described by way of example only and with reference to the accompanying drawings, in which.

Figure 20:
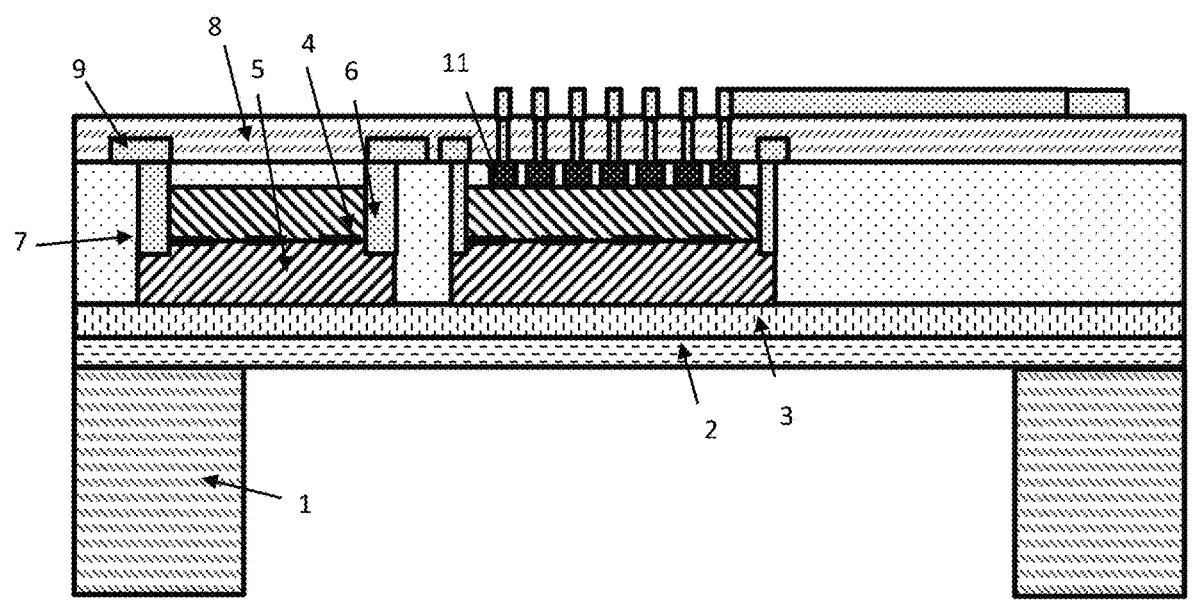
Figure 21:
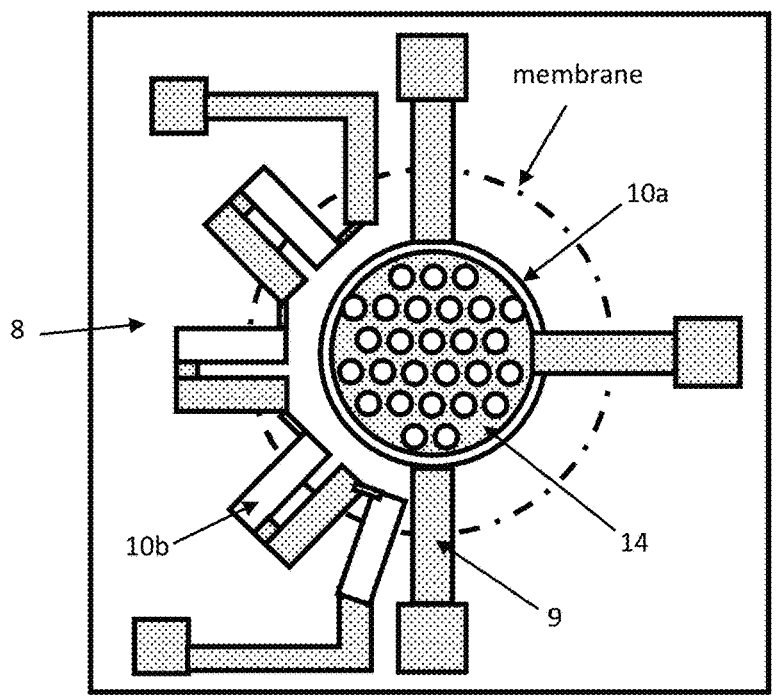
Figure 22:
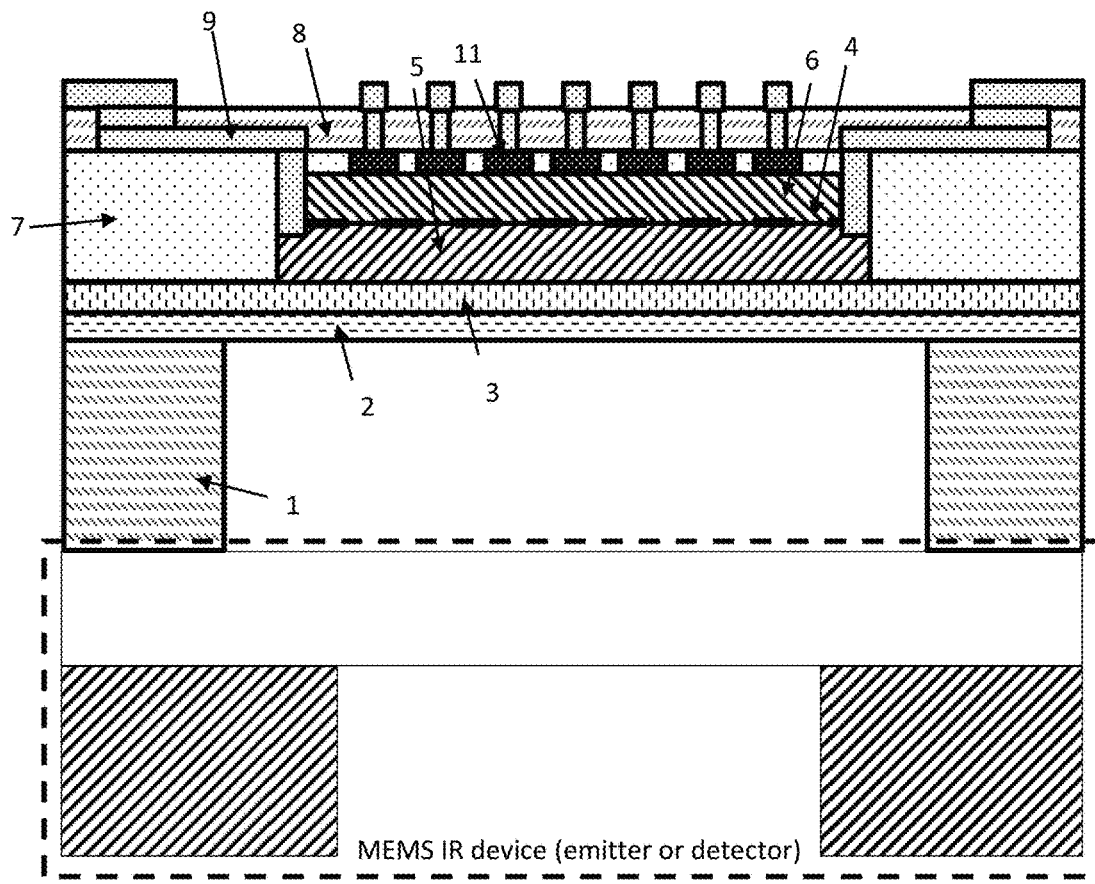
Figure 23:
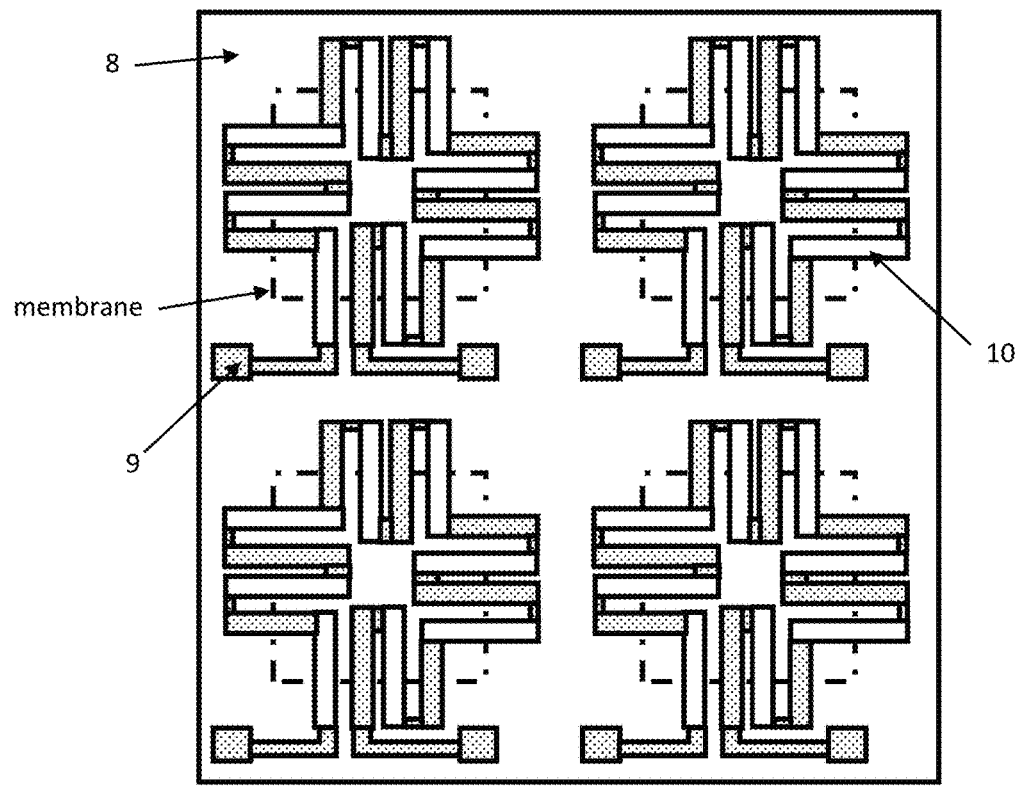
Figure 24:
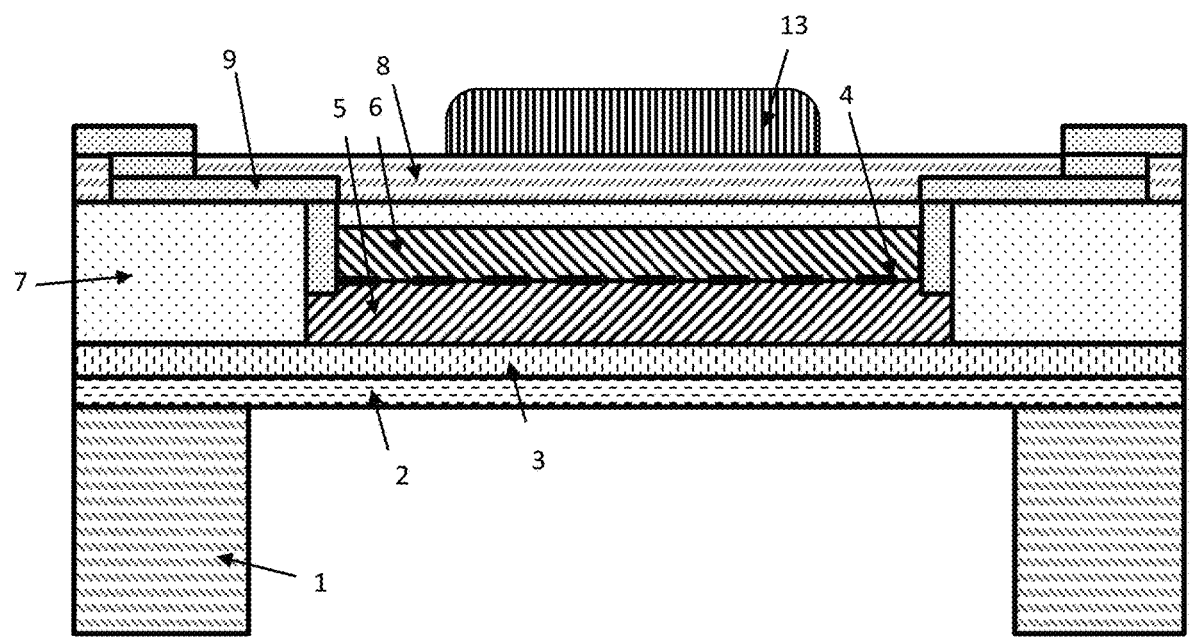
Figure 25:
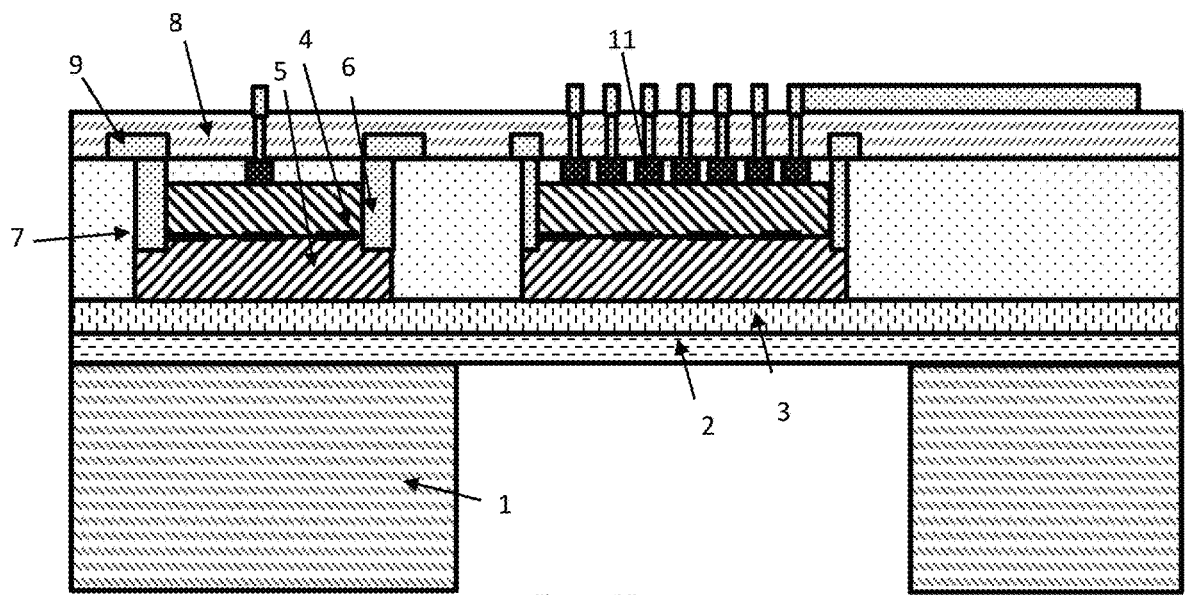

FIG. 20 shows a cross section of a heterostructure-based infra-red device that can be operated as IR detector. The temperature sensing element is in form of a thermopile. The IR detector optical properties are engineered and electrically tuned by mean of a HEMT with a patterned gate;

FIG. 21 shows a top view of a heterostructure-based infra-red device that can be operated as IR detector. The temperature sensing element is in form of a thermopile. The IR detector optical properties are engineered and electrically tuned by mean of a HEMT with a patterned gate;

FIG. 22 shows a cross section of a heterostructure-based infra-red device 3D stacked on top of a MEMS IR device. The heterostructure based IR device is used to engineer and electrically tune by mean of a HEMT with a patterned gate the optical properties of the MEMS IR device below it;

FIG. 23 shows a top view of a 2×2 array of heterostructure-based infra-red devices that can be operated as IR detector array (IR camera). The temperature sensing elements are in form of thermopiles;

FIG. 24 shows a cross section of a heterostructure-based infra-red device that can be operated as IR emitter and/or as IR detector, having an emission/absorption coating; and FIG. 25 shows a cross section of a heterostructure-based infra-red device that can be operated as IR emitter and/or as IR detector. The heating element and/or the temperature sensing element is in form of an HEMT with a patterned gate. Additional the IR device is provided with on-chip circuitry.

DETAILED DESCRIPTION OF THE PREFERRED EMBODIMENTS

Figure 1:
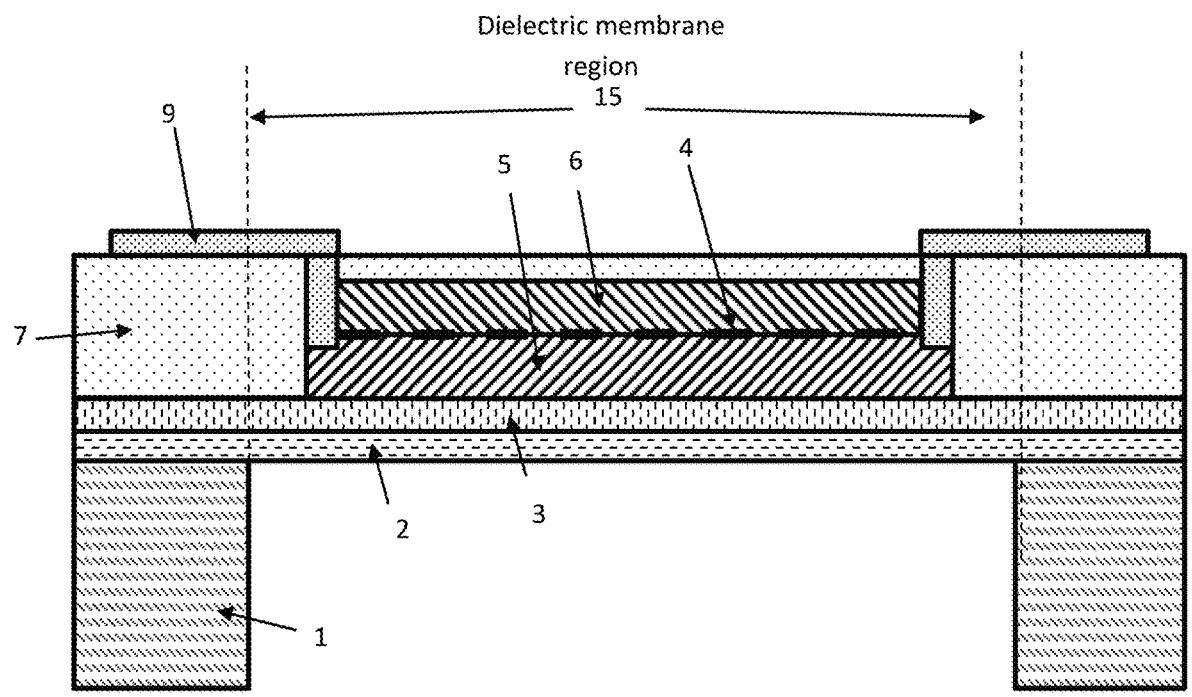
FIG. 1 shows a cross section of a heterostructure based sensor.

FIG. 1 shows a cross section of a heterostructure based sensor. The heterostructure based sensor includes a substrate 1 comprising an etched portion, a nucleation layer 2 and a transition layer 3 grown on the substrate. The nucleation layer 2 and the transition layer 3 form a membrane over the etched portion of the substrate.

A heterostructure based element is formed within the membrane region 15. The membrane region 15 is located immediately adjacent or directly above or below the etched portion of the substrate 1. The membrane region 15 corresponds to the area directly above the cavity (or the etched portion of the substrate 1).

The heterostructure based element comprises a first semiconductor layer 5 and a second semiconductor layer 6. The two semiconductor layers 5, 6 are formed of materials with a dissimilar bandgap (for example, GaN and AlGaN). A two dimensional carrier gas 4 is formed at the interface between the two semiconductor layers 5, 6. The 2D carrier gas 4 is shown as a dashed line 4 on this figure. This may be an 2D electron gas or a 2D hole gas.

The sensor also includes a dielectric layer 7, this electrically and thermally isolates the heterostructure based element, and electrical connections 9.

Figure 2:
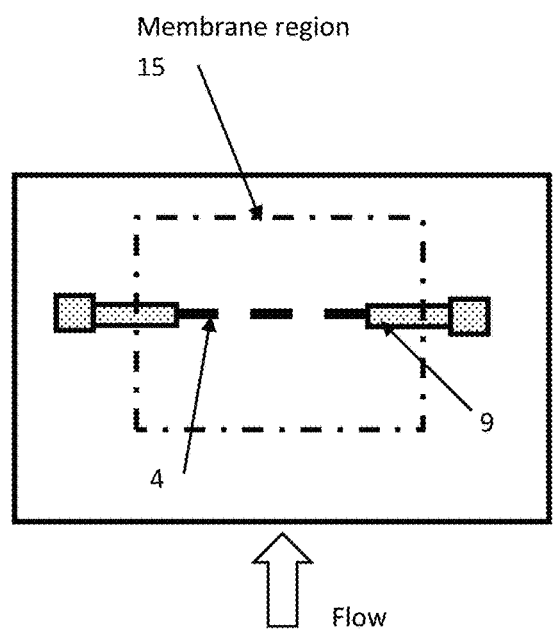
FIG. 2 shows a top view of a heterostructure based sensor.

FIG. 2 shows a schematic top view of the heterostructure based sensor shown in FIG. 1. The reference numbers of FIG. 1 apply equally to FIG. 2. The 2D electron gas 4 is formed within the membrane area and may be configured to operate as a heating element or as a temperature sensing element. In other words, the 2D carrier gas acts similar to a wire. The device may be configured as a flow sensor, where the direction of flow to be measured is shown.

Figure 3:
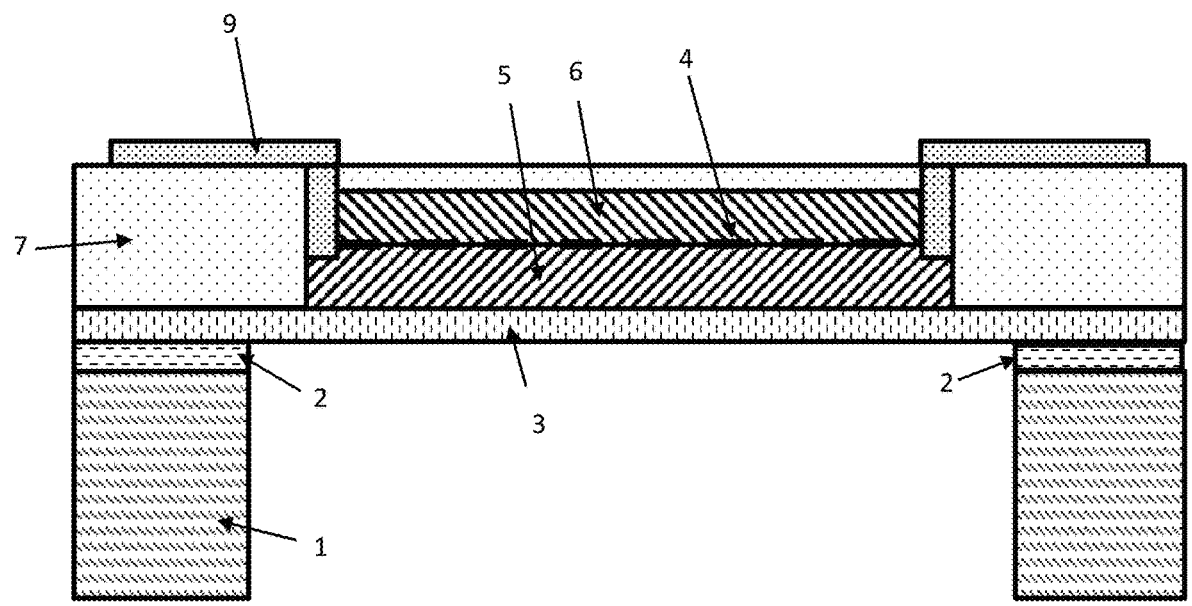
FIG. 3 shows a cross section of a heterostructure based sensor. The nucleation layer has been etched.

FIG. 3 shows a cross section of a heterostructure based sensor in which the nucleation layer 2 has been etched.

Figure 4:
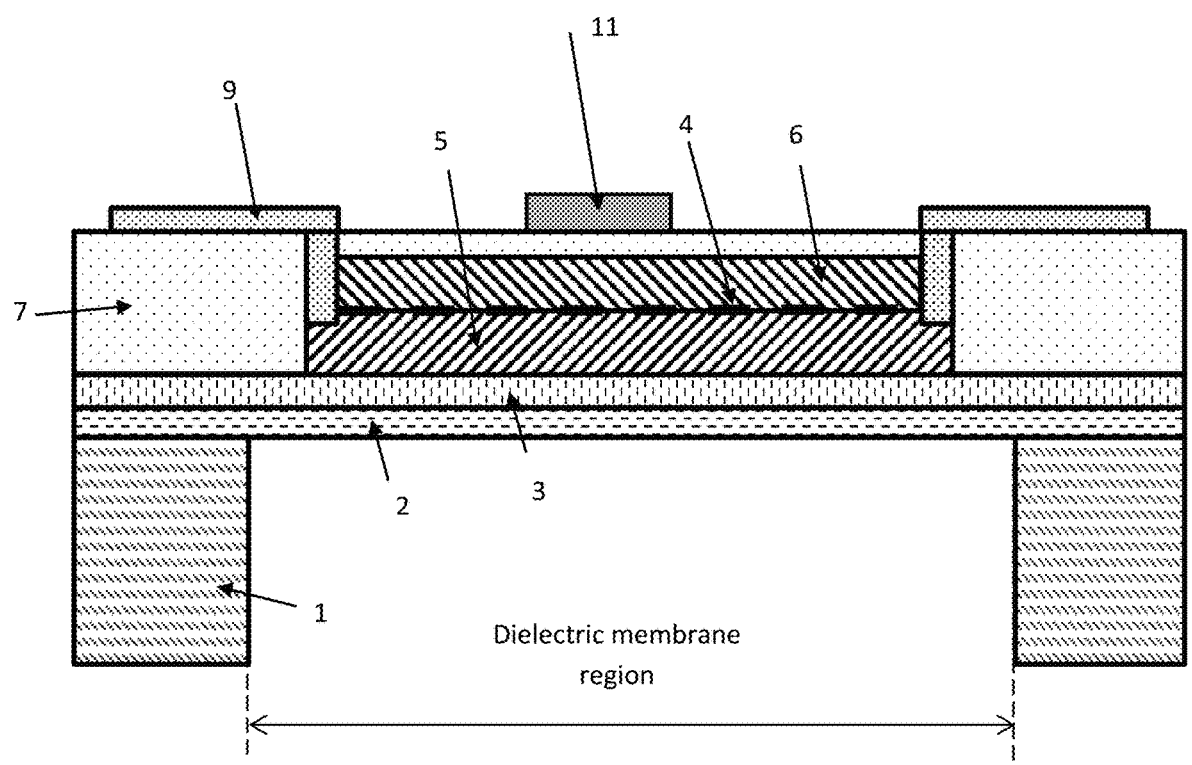
FIG. 4 shows a cross section of a heterostructure based sensor. An additional gate is formed on the sensor.

FIG. 4 shows a cross section of a heterostructure based sensor in which an additional gate 11 is formed on the sensor. The gate could be formed as an insulated gate with a metal on top. The insulating material could be silicon-nitride or silicon-oxide or other oxides or nitrides. Alternatively, the gate could be formed by a Schottky metal or combination of metals, or by a p type GaN gate. The p-type GaN gate could be formed by magnesium doping. An Ohmic or Schottky type metal could be present on the p-type GaN gate.

Figure 5:
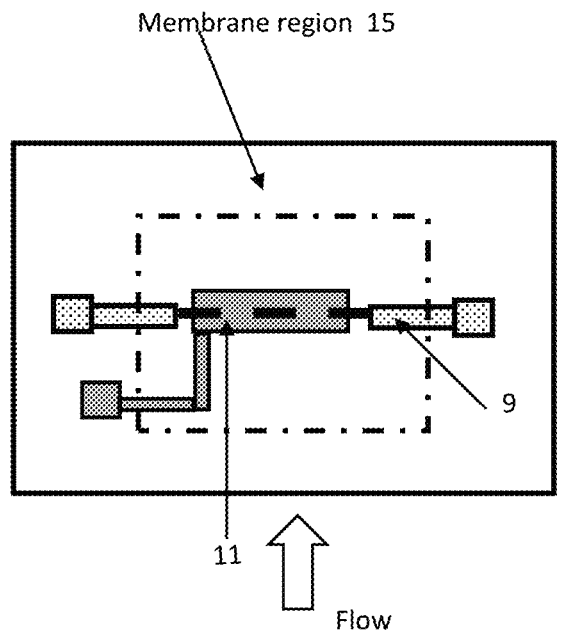
FIG. 5 shows a top view of a heterostructure based sensor. An additional gate is formed on the sensor.

FIG. 5 shows a top view of the heterostructure based device shown in FIG. 4. An additional gate 11 is formed on the sensor. The gate 11 is formed directly above the 2D carrier gas 4.

Figure 6:
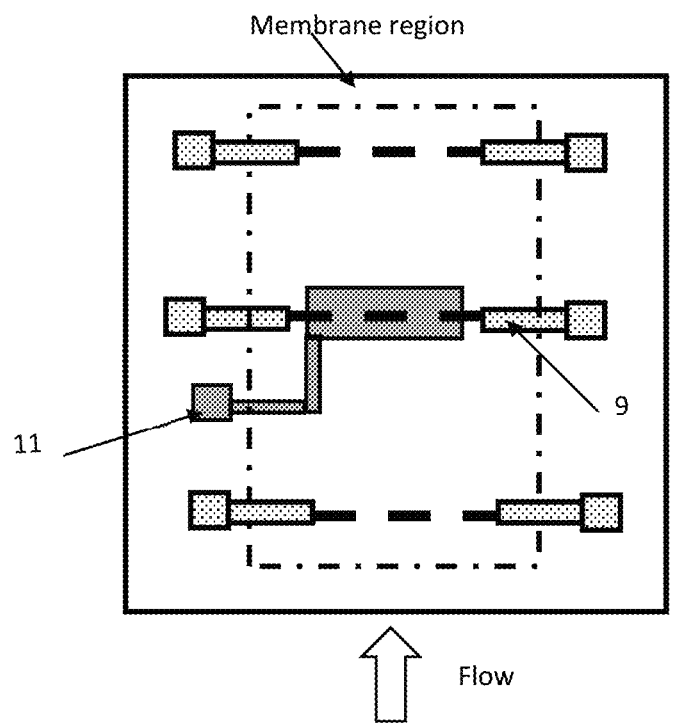
FIG. 6 shows a top view of a heterostructure based sensor. Three elements are formed on the membrane region.

FIG. 6 shows a top view of a heterostructure based sensor, in which three elements are formed on the membrane region. The central element (featuring in this case a gate 11) could be operated as a heater while the other two elements could be operated as temperature sensors. The central element is formed of 2D carrier gas, although the other two elements could also be made of 2D carrier gas layers.

Figure 7:
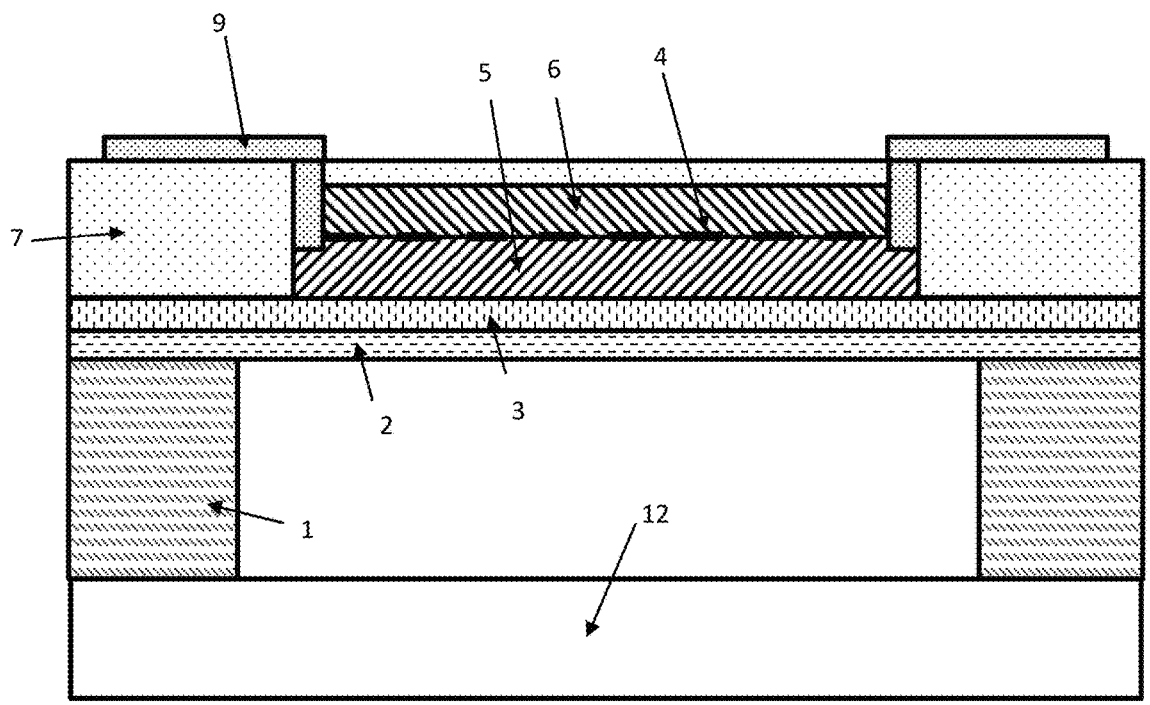
FIG. 7 shows a cross section of a heterostructure based sensor. An ASIC is assembled at the bottom of the sensor for stack-assembly in the same package.

FIG. 7 shows a cross section of a heterostructure based sensor in which an ASIC 12 is assembled at the bottom of the sensor for stack-assembly in the same package.

Figure 8:
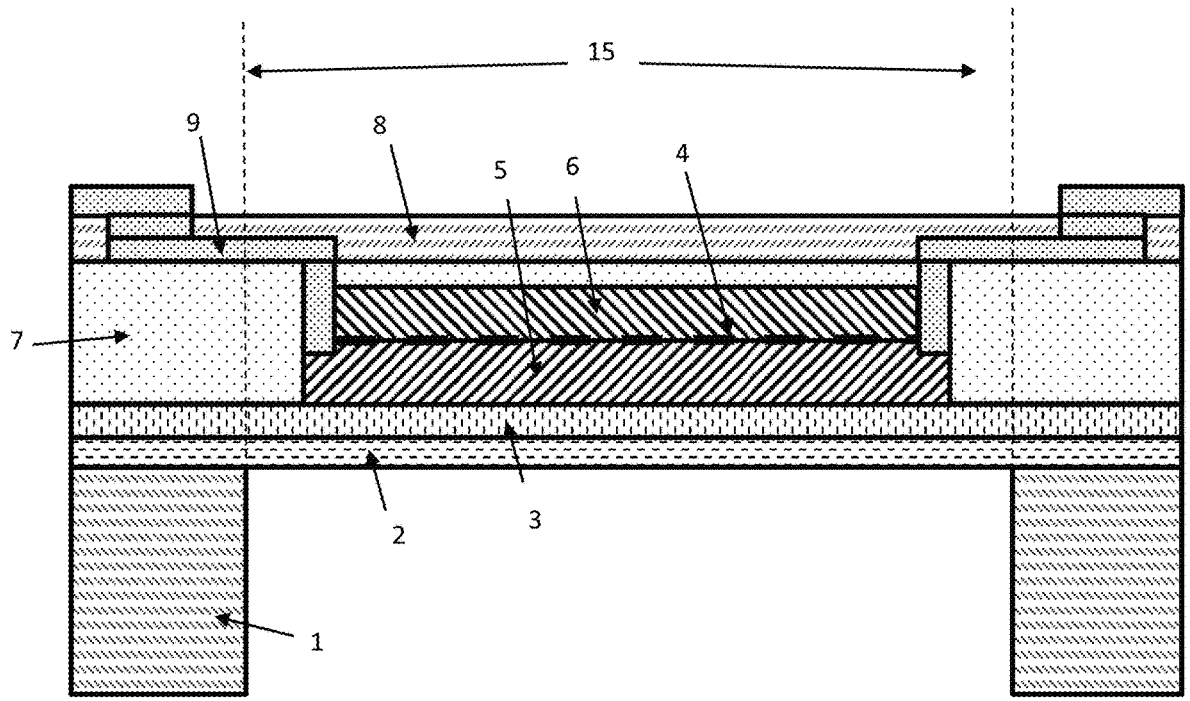
FIG. 8 shows a cross section of a heterostructure-based infra-red device that can be operated as IR emitter and/or as IR detector.

FIG. 8 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region 15 where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. The AlGaN/GaN-based IR device may be configured to operate as IR emitter, wherein the AlGaN/GaN element formed within the membrane region and comprising a 2DEG is configured to operate as a heating element. The current flow within the 2DEG resistive heating element results in Joule heating, and generates IR radiation. Alternatively the AlGaN/GaN-based IR device may be configured to operate as IR detector, wherein the AlGaN/GaN element formed within the membrane region and comprising a 2DEG is configured to operate as a resistive temperature sensing element. IR radiation coming onto the device surface generates an increase in the membrane temperature sensed by the resistive temperature sensing element. Generally speaking, the membrane region 15 is located immediately adjacent or directly above or over the etched portion of the substrate 1. The membrane region 15 corresponds to the area directly above the cavity (or the etched portion) of the substrate 1. The definition of the membrane region 15 as shown in FIG. 1 is applicable in the remaining embodiments and figures described below.

Figure 9:
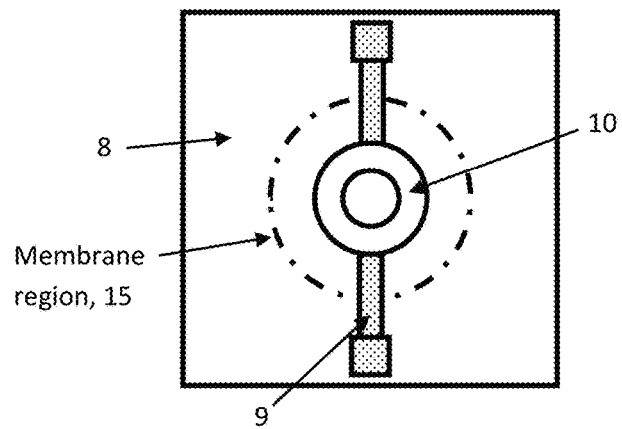
FIG. 9 shows a top view of a heterostructure-based infra-red device that can be operated as IR emitter and/or as IR detector.

FIG. 9 is a schematic top view of a heterostructure-based infra-red device, wherein the AlGaN/GaN element 10 formed within the membrane region and comprising a 2DEG may be configured to operate as a resistive heating element. The current flow within the 2DEG resistive heating element results in Joule heating, and generates IR radiation. Alternatively, the AlGaN/GaN element 10 formed within the membrane region and comprising a 2DEG may be configured to operate as a resistive temperature sensing element. IR radiation coming onto the device surface generates an increase in the membrane temperature sensed by the resistive temperature sensing element. In this specific example the element 10 is chosen to be ring-shaped, but its shape could be any desired by the specific application (e.g. multi ring, spiral, meander, etc.).

Figure 10:
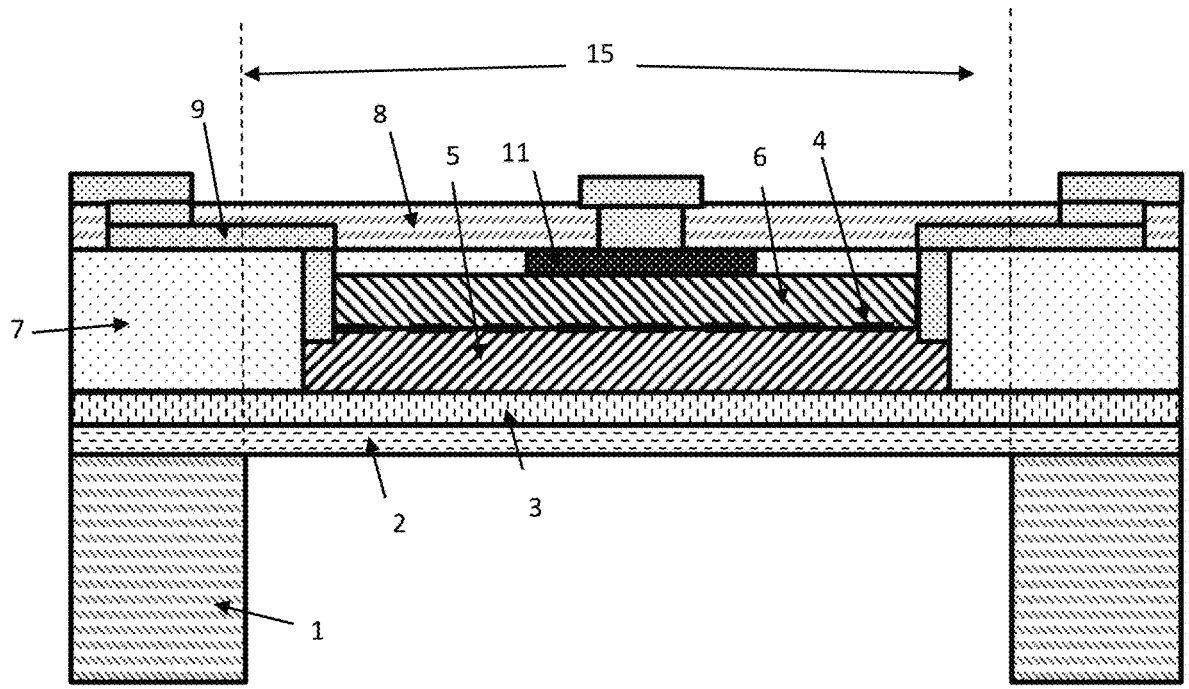
FIG. 10 shows a cross section of a heterostructure-based infra-red device that can be operated as IR emitter and/or as IR detector. The heating element and/or the temperature sensing element is in form of an HEMT.

FIG. 10 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the heterostructure-based device is provided with a gate 11, to modulate the carrier concentration. The AlGaN/GaN-based IR device may be configured to operate as IR emitter, wherein the AlGaN/GaN element formed within the membrane region and comprising a 2DEG is a transistor (e.g. HEMT), and is configured to operate as a heating element. The current flow within the 2DEG results in Joule heating, and generates IR radiation. The use of the gate will allow direct temperature modulation of the heating element, without the use of an external transistor. Alternatively the AlGaN/GaN-based IR device may be configured to operate as IR detector, wherein the AlGaN/GaN element formed within the membrane region and comprising a 2DEG is a transistor (e.g. HEMT), and is configured to operate as a temperature sensing element. IR radiation coming onto the device surface generates an increase in the membrane temperature sensed by the temperature sensing transistor. The presence of the gate 11 will enable the choice of the optimum transistor working regime as temperature sensor. For instance, the transistor may be operated in sub-threshold, linear or saturation regions.

Figure 11:
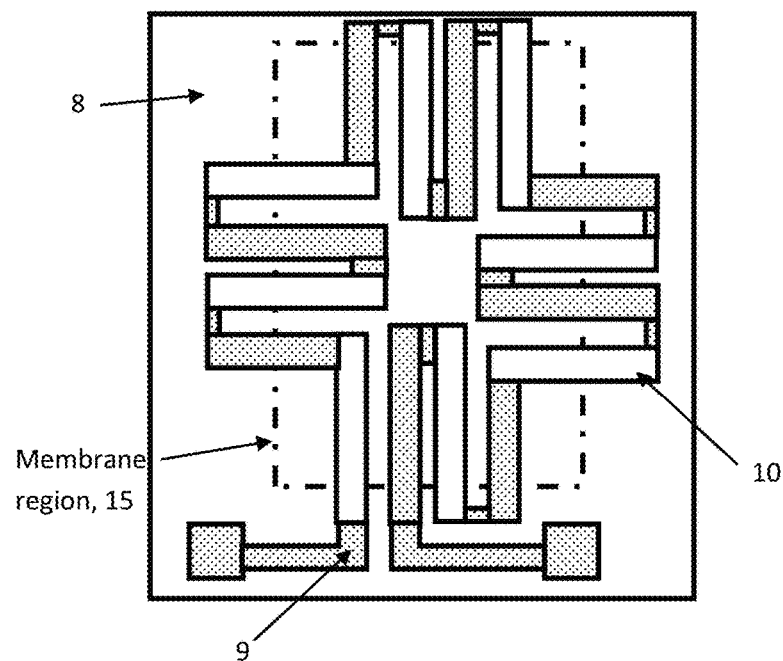
FIG. 11 shows a top view of a heterostructure-based infra-red device that can be operated as IR detector. The temperature sensing element of the IR detector is in form of a thermopile.

FIG. 11 shows a schematic top view of a heterostructure-based infra-red device, wherein the AlGaN/GaN element 10 comprising a 2DEG is configured to operate as a temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect.

Figure 12:
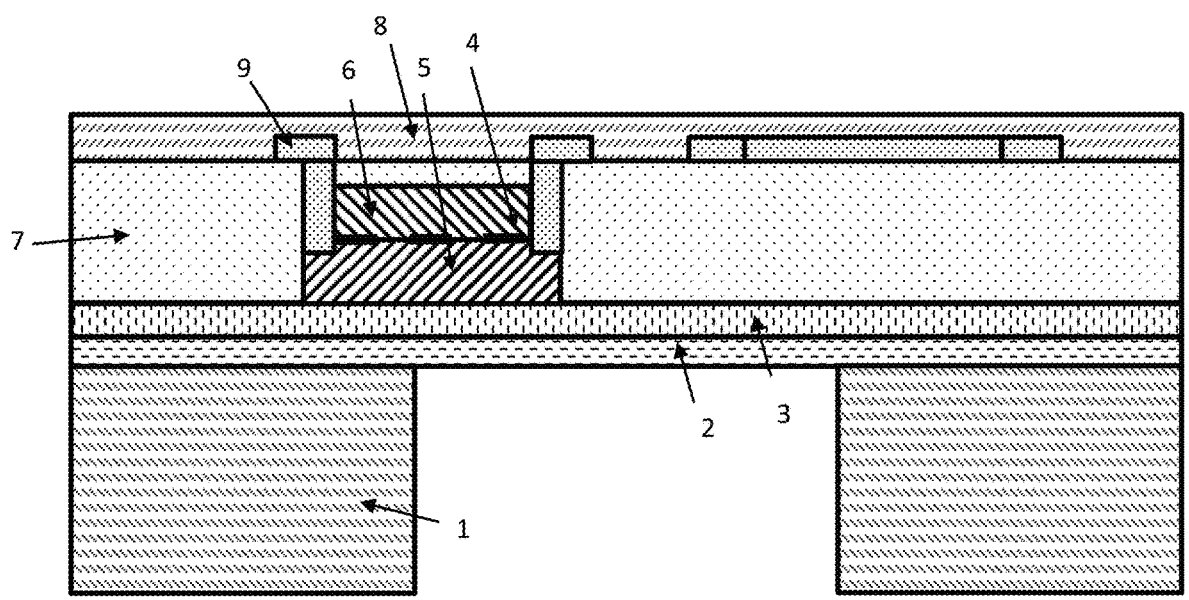
FIG. 12 shows a cross section of a heterostructure-based infra-red device that can be operated as IR detector. The temperature sensing element of the IR detector is in form of a thermopile.

FIG. 12 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. The heterostructure based infra-red device is configured to operate as a temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect. In this specific example a first arm of a thermocouple is formed by the heterostructure and the second arm of a thermocouple is formed by a metal (the same metal used for the electrical connections). However many other options are possible in term of materials forming the second thermocouple arm (e.g. any one of the semiconductors forming the heterostructure, any of the semiconductors forming the heterostructures with a different doping, any other metals available in the process, etc.).

Figure 13:
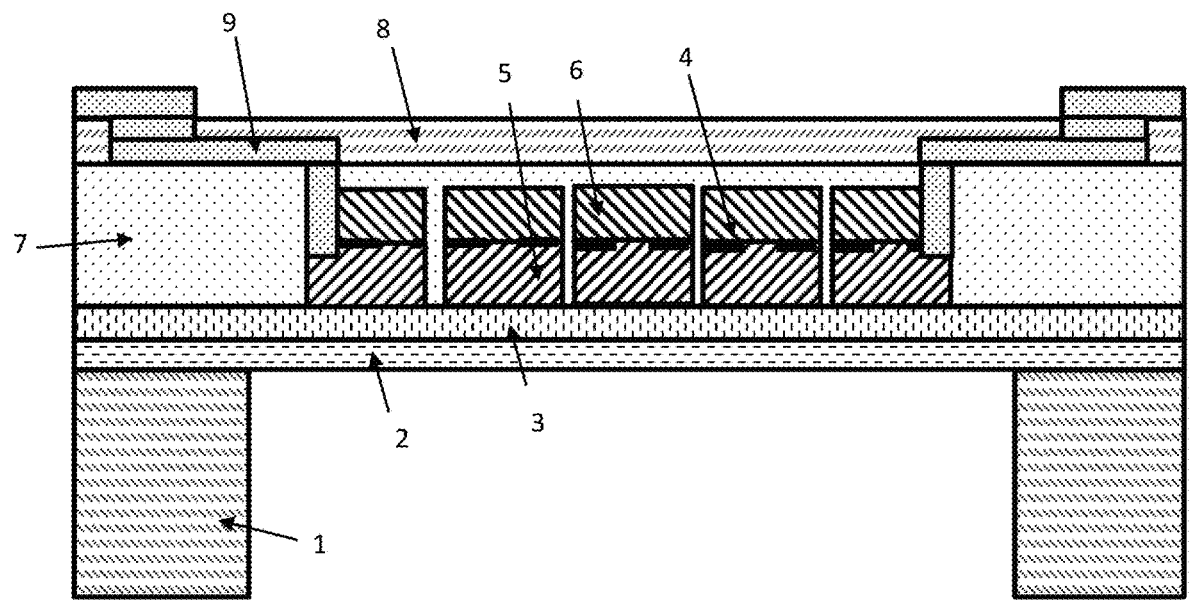
FIG. 13 shows a cross section of a heterostructure-based infra-red device that can be operated as IR emitter and/or as IR detector. The heating element and/or the temperature sensing element is patterned to form a plasmonic structure.

FIG. 13 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. The heterostructure based infra-red device is configured to tailor the optical properties of the IR device. In this specific example, the optical properties of the IR device are engineered by introducing period structures exploiting plasmonic resonances to modify the native overall optical properties of a multilayer structure. For simplicity, the AlGaN/GaN element formed within the membrane region, comprising a 2DEG, and configured to tailor the optical properties of the IR device will be referred to as a plasmonic element hereafter. The plasmonic element is formed by patterning the heterostructure. The pattern geometry defines the optical properties of the IR device.

Figure 14:
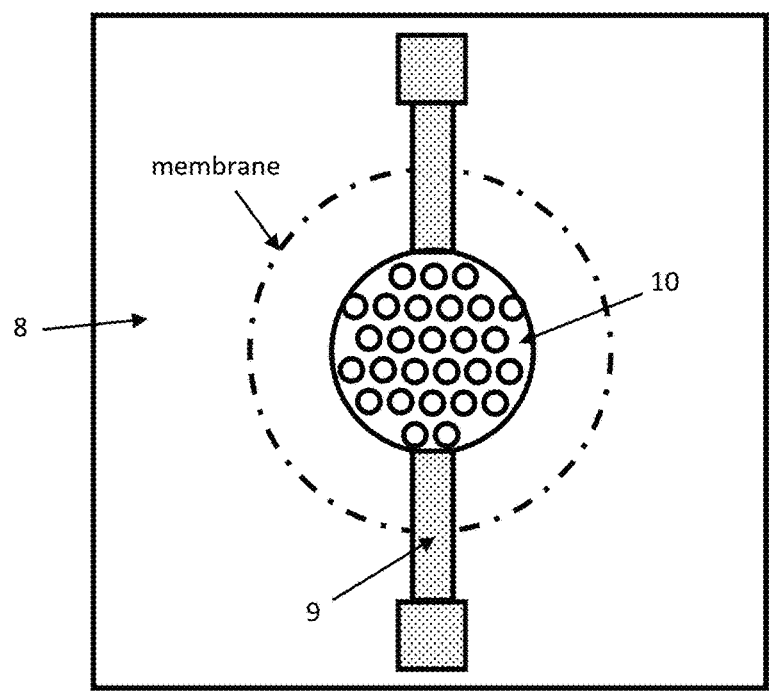
FIG. 14 shows a top view of a heterostructure-based infra-red device that can be operated as IR emitter and/or as IR detector. The heating element and/or the temperature sensing element is patterned to form a plasmonic structure.

FIG. 14 is a schematic top view of a heterostructure-based infra-red device, wherein the AlGaN/GaN element 10 formed within the membrane region and comprising a patterned 2DEG is configured to tailor the optical properties of the IR device. Also, the AlGaN/GaN element 10 may be operated as a heating element. The current flow within the 2DEG resistive heating element results in Joule heating, and generates IR radiation with a tailored IR spectrum. Alternatively, the AlGaN/GaN element 10 formed within the membrane region and comprising a 2DEG may be configured to operate as a resistive temperature sensing element. Only specific wavelengths (the ones for which the device has been tailored to be sensitive to) of the IR radiation coming onto the device surface generates an increase in the membrane temperature sensed by the resistive temperature sensing element. In this specific example the element 10 is chosen to be circular, but its shape could be any desired by the specific application (e.g. multi ring, spiral, meander, etc.), and etched in order to achieve a pattern with hexagonal symmetry, but its symmetry could be any desired by the specific application (e.g. square, etc.). The pattern is formed by circles etched in the heterostructure, but their shape could be any desired by the specific application (e.g. triangular, square, hexagonal, etc.).

Figure 15:
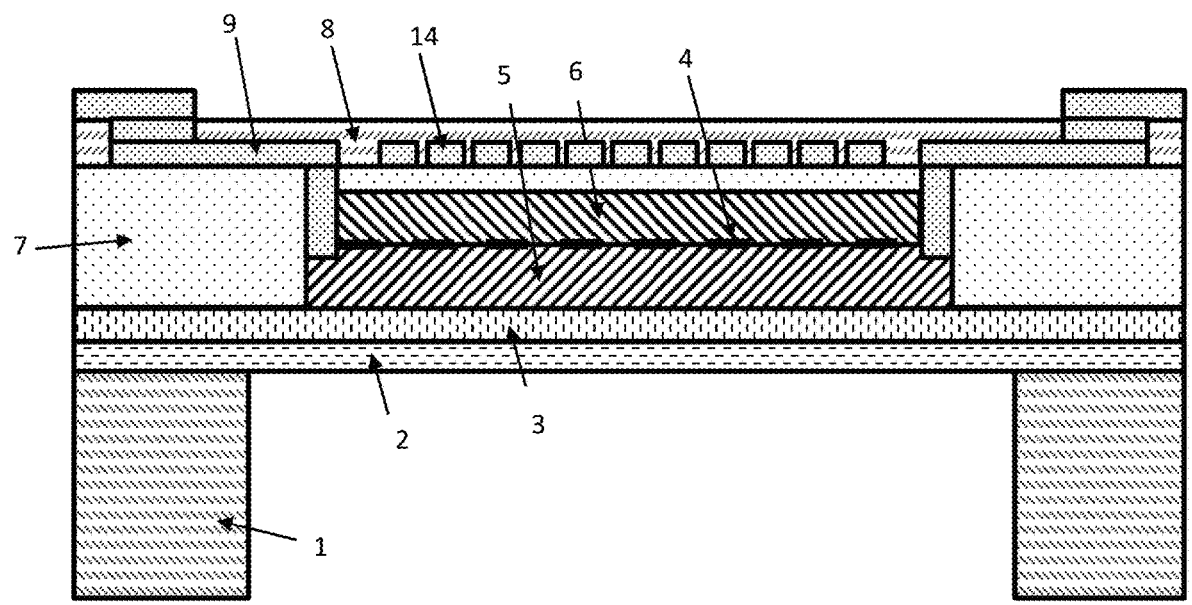
FIG. 15 shows a cross section of a heterostructure-based infra-red device that can be operated as IR emitter and/or as IR detector. The heating element and/or the temperature sensing element is below a plasmonic structure made of metal.

FIG. 15 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the device comprises a plasmonic pattern 14, formed by patterning the layer otherwise used for the electrical interconnections. The pattern geometry defines the optical properties of the IR device. The heterostructure based infra-red device is configured to tailor the optical properties of the IR device. In this specific example, the optical properties of the IR device are engineered by introducing period metallic structures exploiting plasmonic resonances to modify the native overall optical properties of a multilayer structure.

Figure 16:
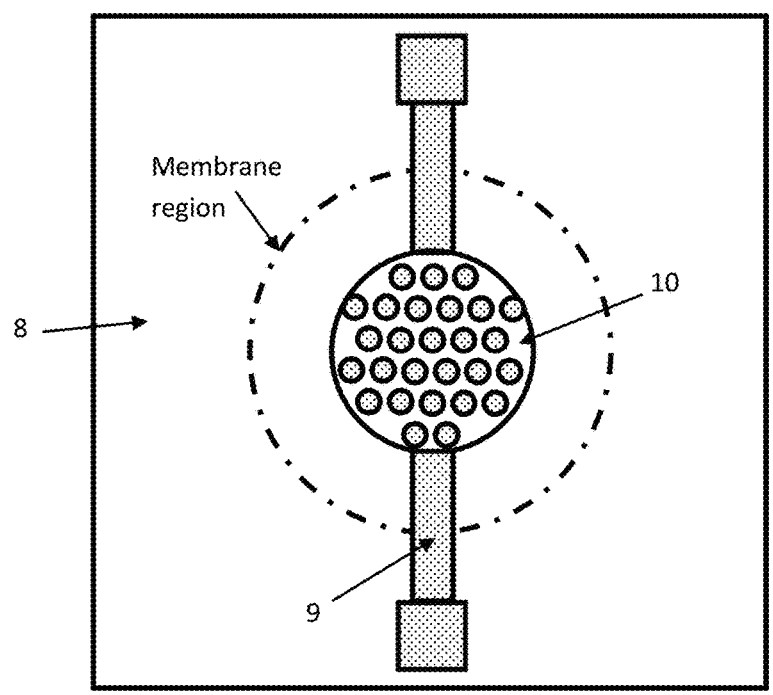
FIG. 16 shows a top view of a heterostructure-based infra-red device that can be operated as IR emitter and/or as IR detector. The heating element and/or the temperature sensing element is below a plasmonic structure made of metal.

FIG. 16 is a schematic top view of a heterostructure-based infra-red device, wherein the AlGaN/GaN element 10 formed within the membrane region and comprising a patterned metal layer is configured to tailor the optical properties of the IR device. Also, the AlGaN/GaN element 10 may be operated as a heating element. The current flow within the 2DEG resistive heating element results in Joule heating, and generates IR radiation with a tailored IR spectrum. Alternatively, the AlGaN/GaN element 10 formed within the membrane region and comprising a 2DEG may be configured to operate as resistive temperature sensing element. Only specific wavelengths (the ones for which the device has been tailored to be sensitive to) of the IR radiation coming onto the device surface generates an increase in the membrane temperature sensed by the resistive temperature sensing element. In this specific example the element 10 is chosen to be circular, but its shape could be any desired by the specific application (e.g. multi ring, spiral, meander, etc.). The metallic pattern has hexagonal symmetry, but its symmetry could be any desired by the specific application (e.g. square, etc.). The pattern is formed by metallic circles, but their shape could be any desired by the specific application (e.g. triangular, square, hexagonal, etc.).

Figure 17:
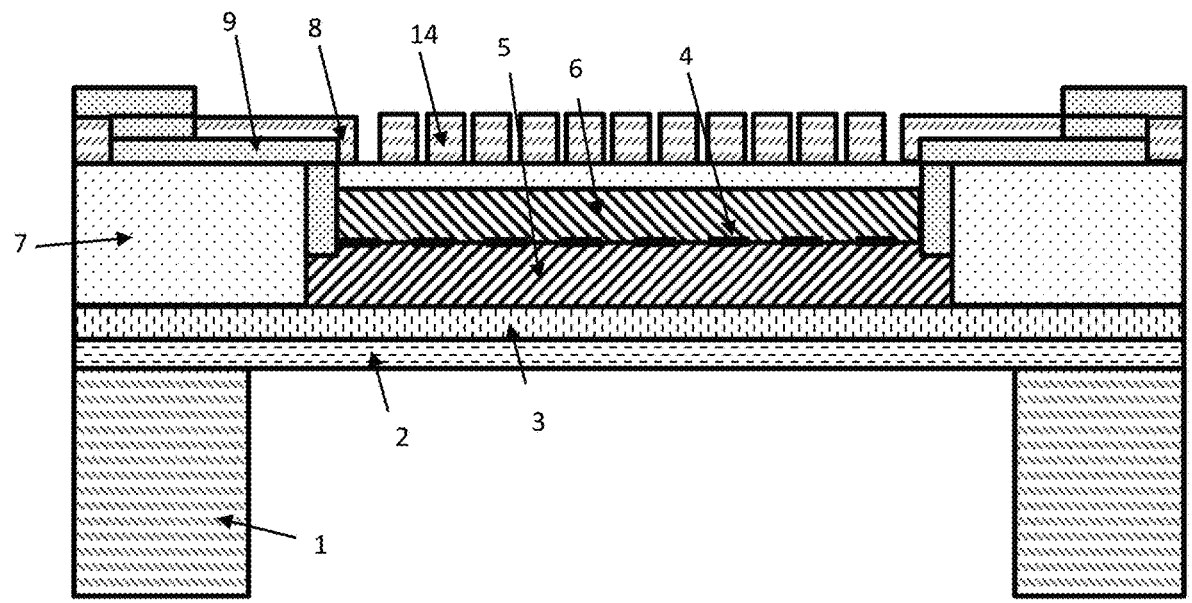
FIG. 17 shows a cross section of a heterostructure-based infra-red device that can be operated as IR emitter and/or as IR detector. The heating element and/or the temperature sensing element is below a plasmonic structure etched in the passivation layer.

FIG. 17 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the device comprises a plasmonic pattern 14, formed by patterning the passivation layer 8. The pattern geometry defines the optical properties of the IR device. The heterostructure based infra-red device is configured to tailor the optical properties of the IR device. In this specific example, the optical properties of the IR device are engineered by introducing periodic dielectric structures exploiting plasmonic resonances to modify the native overall optical properties of a multilayer structure.

Figure 18:
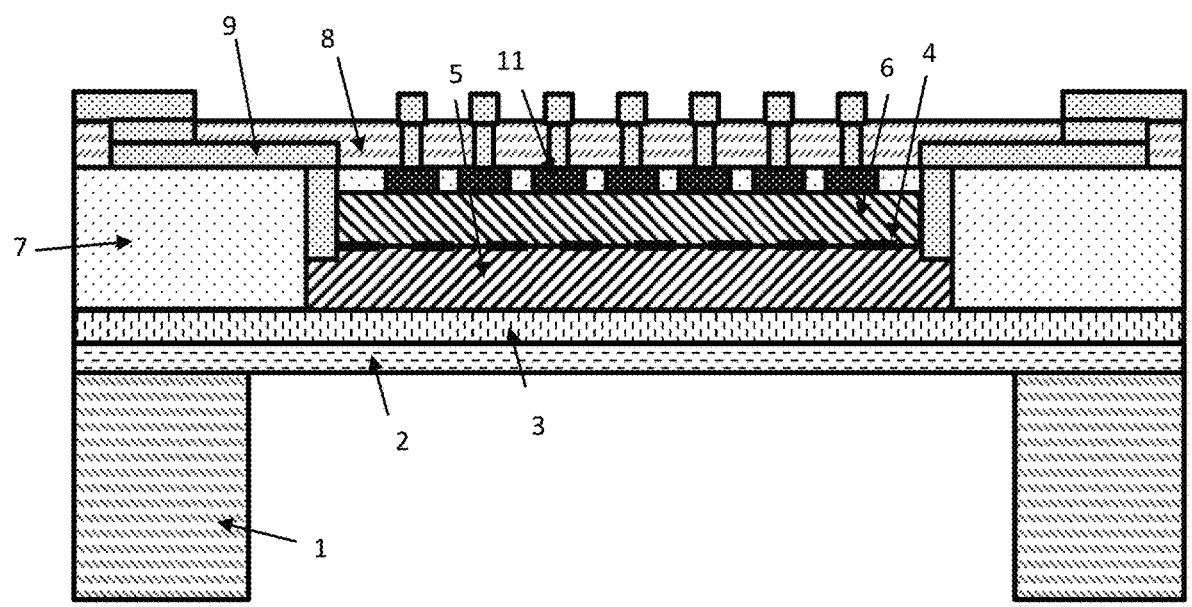
FIG. 18 shows a cross section of a heterostructure-based infra-red device that can be operated as IR emitter and/or as IR detector. The heating element and/or the temperature sensing element is in form of an HEMT with a patterned gate.

FIG. 18 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the device comprises a patterned gate 11. The pattern geometry defines the optical properties of the IR device. The heterostructure based infra-red device is configured to tailor and electrically tune the optical properties of the IR device. In this specific example, the optical properties of the IR device are engineered by introducing periodic gate structures exploiting plasmonic resonances to modify the native overall optical properties of a multilayer structure. The patterned gate 11, maybe used to modulate the carrier concentration and electrically tune the optical properties of the IR device. The AlGaN/GaN-based IR device may be configured to operate as tunable IR emitter, wherein the AlGaN/GaN element formed within the membrane region and comprising a 2DEG is a transistor (e.g. HEMT), and is configured to operate as a heating element. The current flow within the 2DEG results in Joule heating, and generates tailored and electrically tunable IR radiation. The use of the gate will allow direct electrical tenability of the Ir device tailored spectral properties. Alternatively the AlGaN/GaN-based IR device may be configured to operate as IR detector with tailored and electrically tunable optical properties, wherein the AlGaN/GaN element formed within the membrane region and comprising a 2DEG is a transistor (e.g. HEMT), and is configured to operate as temperature sensing element. Only specific wavelengths (the ones for which the device has been tailored and/or electrically tuned to be sensitive to) of the IR radiation coming onto the device surface generates an increase in the membrane temperature sensed by the temperature sensing transistor. The presence of the gate 11 will also enable the choice of the optimum transistor working regime as temperature sensor. For instance, the transistor may be operated in sub-threshold, linear or saturation regions.

Figure 19:
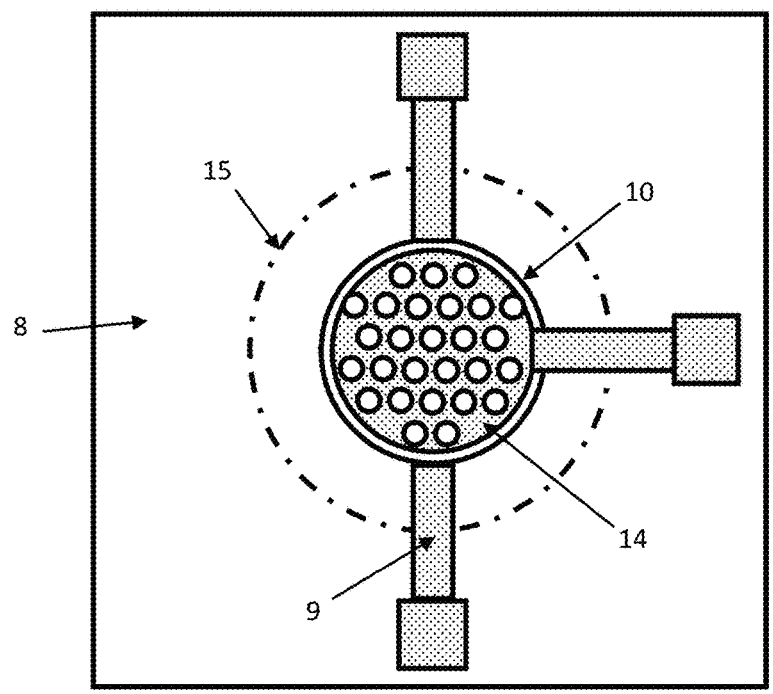
FIG. 19 shows a top view of a heterostructure-based infra-red device that can be operated as IR emitter and/or as IR detector. The heating element and/or the temperature sensing element is in form of an HEMT with a patterned gate.

FIG. 19 is a schematic top view of a heterostructure-based infra-red device, wherein the AlGaN/GaN element 10 formed within the membrane region and comprising a patterned gate is configured to tailor and electrically tune the optical properties of the IR device. Also, the AlGaN/GaN element 10 may be operated as a heating element. The current flow within the 2DEG resistive heating element results in Joule heating, and generates IR radiation with a tailored and electrically tunable IR spectrum. Alternatively, the AlGaN/GaN element 10 formed within the membrane region and comprising a 2DEG may be configured to operate as temperature sensing element. Only specific wavelengths (the ones for which the device has been tailored and electrically tuned to be sensitive to) of the IR radiation coming onto the device surface generates an increase in the membrane temperature sensed by the temperature sensing element. In this specific example the element 10 is chosen to be circular, but its shape could be any desired by the specific application (e.g. multi ring, spiral, meander, etc.). The gate pattern has hexagonal symmetry, but its symmetry could be any desired by the specific application (e.g. square, etc.). The pattern is formed by etched circles, but their shape could be any desired by the specific application (e.g. triangular, square, hexagonal, etc.).

FIG. 20 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; heterostructure-based elements formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based elements; a passivation layer 8; and electrical connections 9. A first heterostructure based infra-red device is configured to operate as temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect. In this specific example a first arm of a thermocouple is formed by the heterostructure and the second arm (not shown in the drawing) of a thermocouple is formed by a metal (the same metal used for the electrical connections). However many other options are possible in term of materials forming the second thermocouple arm (e.g. any one of the semiconductors forming the heterostructure, any of the semiconductors forming the heterostructures with a different doping, any other metals available in the process, etc.). A second heterostructure based infra-red device is configured to tailor and electrically tune the optical properties of the IR device. In this specific example, the optical properties of the IR device are engineered by introducing periodic gate structures exploiting plasmonic resonances to modify the native overall optical properties of a multilayer structure. The patterned gate 11, maybe used to modulate the carrier concentration and electrically tune the optical properties of the IR device.

FIG. 21 is a schematic top view of a heterostructure-based infra-red device, wherein a first AlGaN/GaN element 10a formed within the membrane region and comprising a patterned gate is configured to tailor and electrically tune the optical properties of the IR device. A second AlGaN/GaN element 10b formed within the membrane region and comprising a 2DEG may be configured to operate as temperature sensing element.

Only specific wavelengths (the ones for which the first element 10a has been tailored and electrically tuned to be sensitive to) of the IR radiation coming onto the device surface generates an increase in the membrane temperature sensed by the temperature sensing element 10b. In this specific example the element 10a is chosen to be circular, but its shape could be any desired by the specific application (e.g. multi ring, spiral, meander, etc.). The gate pattern has hexagonal symmetry, but its symmetry could be any desired by the specific application (e.g. square, etc.). The pattern is formed by etched circles, but their shape could be any desired by the specific application (e.g. triangular, square, hexagonal, etc.). The second AlGaN/GaN element 10b is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect.

FIG. 22 shows a cross section of the heterostructure based IR device described in FIG. 11 3D stack on a second IR device. The second IR device may be any of the devices previously disclosed or any other IR device, even realised in a different technology (in this specific example a MEMS IR device), in order to provide the second IR device with optical properties different from its native ones. The stacking process may take place at wafer level and may allow the creation of a cavity at low pressure (lower than ambient pressure), in order to reduce thermal dissipation and thus improve the second IR device performance.

FIG. 23 shows a schematic top view of a 2×2 array of heterostructure based IR devices described in FIG. 4, wherein each AlGaN/GaN element 10 comprising a 2DEG is configured to operate as temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect. In this specific example an array of thermopile is presented, but any combination in form of array of the previously disclosed devices is possible.

FIG. 24 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore the device comprises an emission/absorption coating 13. The AlGaN/GaN-based IR device may be configured to operate as IR emitter, wherein the AlGaN/GaN element formed within the membrane region and comprising a 2DEG is configured to operate as a heating element. The current flow within the 2DEG resistive heating element results in Joule heating, and generates IR radiation. Alternatively the AlGaN/GaN-based IR device may be configured to operate as IR detector, wherein the AlGaN/GaN element formed within the membrane region and comprising a 2DEG is configured to operate as resistive temperature sensing element. IR radiation coming onto the device surface generates an increase in the membrane temperature sensed by the resistive temperature sensing element.

FIG. 25 shows a cross-section of the heterostructure-based infra-red device described in FIG. 11. Furthermore the device also comprises on chip circuitry, in the drawing in form of a HEMT off-membrane. The circuitry may also be on-membrane. If silicon is used as starting substrate CMOS circuitry may also be integrated in substrate 1.

The skilled person will understand that in the preceding description and appended claims, positional terms such as 'above', 'overlap', 'under', 'lateral', etc. are made with reference to conceptual illustrations of an device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above may be reversed, the resulting devices still being in accordance with embodiments of the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

LIST OF REFERENCE NUMERALS 1 substrate
2 Nucleation region
3 Transition region
4 heterointerface 5 GaN
6 AlGaN
7 Dielectric layer
8 Passivation layer
9 Electrical connections
10 AlGaN/GaN element
11 gate
12 ASIC
13 Absorption/emission coating
14 plasmonic layer
15 membrane region

The invention claimed is:

1. A heterostructure-based sensor comprising:
a substrate comprising an etched portion and a substrate portion;
a device region located on the etched portion and the substrate portion, wherein the device region comprises at least one membrane region, and wherein the at least one membrane region is an area over the etched portion of the substrate; and
at least one heterostructure-based element located at least partially within or on the at least one membrane region, the heterostructure-based element comprising at least one two dimensional carrier gas, wherein the at least one heterostructure-based element comprises a first III-nitride semiconductor layer having a first band gap and a second III-nitride semiconductor layer having a second bandgap different from the first band gap disposed on the first III-nitride semiconductor layer, wherein the two dimensional carrier gas is formed between the first and second III-nitride semiconductor layers, and wherein the dimensional carrier gas is configured to operate as a first heating element.

2. A sensor according to claim 1, wherein the at least one membrane region is configured at a higher temperature than the substrate portion.

3. A sensor according to claim 1, wherein the heterostructure-based element comprises a first part located within or on the at least one membrane region, and a second part located outside the at least one membrane region; and wherein the first part of the heterostructure-based element is configured to be exposed to a higher temperature than the second part of the heterostructure-based element.

4. A sensor according to claim 1, wherein the sensor is configured as a gas sensor or wherein the sensor is configured as a flow sensor, or wherein the sensor is configured as a thermal conductivity sensor.

5. A sensor according to claim 1, wherein the first III-nitride semiconductor layer comprises any one of gallium nitride (GaN), aluminium gallium nitride (AlGaN) and indium aluminium gallium nitride (InAlGaN); and wherein the second III-nitride semiconductor layer comprises any one of gallium nitride (GaN), aluminium gallium nitride (AlGaN) and indium aluminium gallium nitride (InAlGaN).

6. A sensor according to claim 5, wherein the at least one two dimensional carrier gas is a two dimensional electron gas (2DEG) or a two dimensional hole gas (2DHG).

7. A sensor according to claim 1, wherein the first heating element is any one of a self-heated resistor, a self-heated diode, a self-heated transistor, or a self-heated transistor in diode configuration.

8. A sensor according to claim 1, wherein the two dimensional carrier gas is configured to operate as a first temperature sensing element.

9. A sensor according to claim 8, wherein the first temperature sensing element comprises any one of a resistor, a transistor, a diode or a transistor in a diode configuration; or wherein the first temperature sensing element comprises a thermopile, wherein the thermopile comprises a plurality of thermocouples, wherein each thermocouple comprises two arms coupled together to form a hot junction located within the membrane region and a cold junction located outside the membrane region.

10. A sensor according to claim 8, wherein the first temperature sensing element is configured to measure heat exchange between the heterostructure-based element and a fluid, and wherein the sensor is configured to correlate the heat exchange to at least one property of the fluid so as to differentiate between forms of the fluid.

11. A sensor according to claim 1, further comprising a second heating element located at least partially within or on the at least one membrane region; and wherein the at least one heterostructure-based element is located at least partially within or on a first membrane region, and wherein the second heating element is located at least partially within or on a first membrane region.

12. A sensor according to claim 1, further comprising a second temperature sensing element located at least partially within or on the at least one membrane region; and wherein the at least one heterostructure-based element is located at least partially within or on a first membrane region, and wherein the second temperature sensing element is located at least partially within or on a first membrane region.

13. A sensor according to claim 12, wherein one of the temperature sensing elements is configured to use for flow sensing and another of the temperature sensing elements is configured to recalibrate said one of the temperature sensing elements; or wherein when one of the temperature sensing elements is configured to fail and another temperature sensing element is configured to replace said one of the temperature sensing elements.

14. A sensor according to claim 1, comprising circuitry placed outside the chip area using application specific integrated circuit (ASIC) or a discrete component, or a combination of ASIC and the discrete component.

15. A sensor according to claim 1, wherein the heterostructure-based element is configured to operate as a diode in a forward bias mode in which a forward voltage across the heterostructure-based element decreases linearly with a temperature when operated at a constant forward current; or wherein the heterostructure-based element is configured to operate in a reverse bias mode where a leakage current is exponentially dependent on a temperature.

16. A sensor according to claim 1, further comprising a further etched portion in the substrate and a further membrane region over an area of the further etched portion of the substrate; and further comprising a pressor sensor located in the further membrane region, and wherein the pressor sensor comprises at least one piezo-element.

17. A method of manufacturing a heterostructure-based sensor comprising:
forming at least one membrane region on a substrate comprising an etched portion, wherein the at least one membrane region is an area over the etched portion of the substrate; and
forming at least one heterostructure-based element at least partially within or on the at least one membrane region, wherein the at least one heterostructure-based element comprises at least one two dimensional carrier gas and wherein the at least one heterostructure-based element comprises a first III-nitride semiconductor layer having a first band gap and a second III-nitride semiconductor layer having a second bandgap different from the first band gap disposed on the first III-nitride semiconductor layer, and wherein the two dimensional carrier gas is formed between the first and second III-nitride semiconductor layers and configured to operate as a first heating element.

* * * * *